United States Patent
Fujimoto

(10) Patent No.: US 6,608,504 B2
(45) Date of Patent: Aug. 19, 2003

(54) SAMPLE-AND-HOLD AMPLIFIER CIRCUIT AND PIPELINED A/D AND D/A CONVERTERS USING SAMPLE HOLD AMPLIFICATION CIRCUIT

(75) Inventor: Yoshihisa Fujimoto, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/932,025

(22) Filed: Aug. 20, 2001

(65) Prior Publication Data

US 2002/0024363 A1 Feb. 28, 2002

(30) Foreign Application Priority Data

Aug. 28, 2000 (JP) ........................ 2000-258054

(51) Int. Cl.[7] ............................................. G11C 27/02
(52) U.S. Cl. ..................... 327/94; 327/344; 327/554; 341/122; 341/144
(58) Field of Search ....................... 327/91, 93, 94–96, 327/336, 337, 341, 344, 350, 351, 554, 561–563; 341/155, 157, 161, 118, 122–125, 144, 150, 146; 330/310, 311

(56) References Cited

U.S. PATENT DOCUMENTS

| 4,404,479 | A | * | 9/1983 | Toyomaki | 327/95 |
| 4,438,354 | A | * | 3/1984 | Haque et al. | 327/337 |
| 4,691,125 | A | * | 9/1987 | Rybicki | 327/96 |
| 5,291,074 | A | * | 3/1994 | Nayebi | 327/379 |
| 5,874,912 | A | * | 2/1999 | Hasegawa | 341/155 |

OTHER PUBLICATIONS

"A 14–Bit 10–MHz Calibration–Free CMOS Pipelined A/D Converter" (L.A. Singer et al, 1996 Symposium on VLSI Circuits Digest of Technical Papers, pp. 94–95).

* cited by examiner

*Primary Examiner*—Minh Nguyen
(74) *Attorney, Agent, or Firm*—Nixon & Vanderhye P.C.

(57) ABSTRACT

A sample-and-hold amplifier circuit has a switch, provided between an operational amplifier stage and an inverting amplifier stage, for connecting or cutting off the connection of the operational amplifier stage and the inverting amplifier stage. During the first operation phase ($\phi 1$), the first and second switches are switched to the $\phi 1$ side, the third switch is conductive, and the switch for connecting or cutting off the connection is nonconductive. Thus, sampling can be carried out so that first and second capacitors are charged by predetermined electrical charges. During the second operation phase ($\phi 2$), the first and second switches are switched to the ($\phi 2$ side, the third switch is nonconductive, and the switch for connecting or cutting off the connection is conductive.

19 Claims, 15 Drawing Sheets

SAMPLE-AND-HOLD AMPLIFIER CIRCUIT AND PIPELINED A/D AND D/A CONVERTERS USING SAMPLE HOLD AMPLIFICATION CIRCUIT

FIELD OF THE INVENTION

The present invention relates to an amplifier circuit of high precision type having a sample-and-hold function, relates to pipelined A/D (analog-to-digital) and D/A (digital-to-analog) converters respectively using such an amplifier circuit of high precision type, and particularly relates to the circuits and converters realizing low power consumption and high operational speed.

BACKGROUND OF THE INVENTION

Conventionally, when realizing an amplifier circuit of high precision type having a sample-and-hold function (hereinafter referred to as SHA circuit), it was necessary to use an operational amplifier having a high DC gain. According to the operational amplifier having such a high DC gain, a plurality of operational amplifiers are connected with each other in a series manner. For example, IEEE Symposium on VLSI Circuits, pages 94 to 95, published in 1996, discloses an SHA circuit in which two operational amplifier stage are used and a pipelined A/D converter using such an SHA circuit. The following description deals with the operational principle of the SHA circuit with reference to FIG. 13.

The SHA circuit shown in FIG. 13 is provided with an operational amplifier 100, capacitors 106p and 106m that carry out the samplings of respective input signals from voltages VINP and VINM, capacitors 107p and 107m via which respective negative feedback are formed in the operational amplifier 100, phase compensation capacitors 104p and 104m, and a plurality of switches 103, 105p, 107p, 109p, 105m, 108m, and 109m which are respectively realized by an analog switch. The operational amplifier 100 is realized by first and second operational amplifier stages 101 and 102 that are connected with each other in a series manner so as to respectively carry out the sample-and-hold operation, the amplification, and addition and subtraction operations with respect to the analog signal with high precision. The phase compensation capacitors 104p and 104m compensate the deterioration of phase margin occurred when the first and second operational amplifier stages 101 and 102 are connected with each other in a series manner.

According to the SHA circuit having the above circuit configuration, in a sampling phase φs during which the input signal is subjected to the sampling, (a) two pairs of input-output terminals of the first operational amplifier stage 101 are connected with each other (short-circuited) via the switches 105p and 105m, respectively and (b) two output terminals of the second operational amplifier stage 102 are connected with each other (short-circuited) via the switch 103. The switch 108p is operated so that the voltage VINP is applied to an electrode of the capacitor 106p. The switch 109p is operated so that a reference voltage VREF is applied to an electrode of the capacitor 107p which is provided on the upper stream side of the feedback during the negative feedback. The switch 108m is operated so that the voltage VINM is applied to an electrode of the capacitor 106m on the input terminal side. The switch 109m is operated so that the reference voltage VREF is applied to an electrode of the capacitor 107m which is provided on the upper stream side of the feedback during the negative feedback. This allows that the capacitor 106p carries out the sampling of one input signal from the voltage VINP, the capacitor 106m carries out the sampling of another input signal from the voltage VINM, and the capacitors 107p and 107m carry out the sampling of the difference between the reference voltage VREF and an offset voltage (1/f noise) of the first operational amplifier stage 101, respectively.

In general, the gate area of an input transistor in the second operational amplifier stage 102 is several times to several tens times as large as that of the first operational amplifier stage 101. This causes the offset voltage and the 1/f noise to be smaller in the second operational amplifier stage 102 than in the first operational amplifier stage 101. The offset voltage and the 1/f noise of the second operational amplifier stage 102 that are viewed from the input terminals of the first operational amplifier stage 101 are equal to the division of the offset voltage of the second operational amplifier stage 102 by the DC gain A1 of the first operational amplifier stage 101. Accordingly, in most cases, the offset voltage and the 1/f noise are negligible.

In the next hold phase φh, (a) the two pairs of input and output terminals of the first operational amplifier stage 101 are cut off by the switches 105p and 105m, respectively and (b) the two output terminals of the second operational amplifier stage 102 are also cut off by the switch 103. The switch 108p is operated so that the reference voltage VREF is applied to the capacitor 106p. The switch 109p is operated so that a voltage VOUTP which is one output of the second operational amplifier stage 102 is applied to the electrode of the capacitor 107p which is provided on the upper stream side of the negative feedback. The switch 108m is operated so that the reference voltage VREF is applied to the electrode of the capacitor 106m on the input terminal side. The switch 109m is operated so that a voltage VOUTM which is another output of the second operational amplifier stage 102 is applied to the electrode of the capacitor 107m which is provided on the upper stream side of the negative feedback. In the sampling phase φs, the calculation is carried out in accordance with the conservation law of electric charges between the electric charges charged by the capacitor 106p and the electric charges charged by the capacitor 107p. Also, the calculation is carried out in accordance with the conservation law of electric charges between the electric charges charged by the capacitor 106m and the electric charges charged by the capacitor 107m. The calculations allow to output a voltage (VOUTP−VOUTM) that is the difference between the two output terminals of the second operational amplifier stage 102.

FIG. 14 is a block diagram showing a circuit configuration of a conventional pipelined A/D converter. In the pipelined A/D converter, a sample-and-hold circuit 111 that holds voltages VINP and VINM of the input signal, and a plurality of sub-stages STG11, STG12, STG13, and STG14 are connected with each other in this order in a series manner. Each of the sub-stages is connected with a digital error correction circuit (logic) 119. The sub-stage STG11 is composed of a sub-D/A converter 112 and a sub-A/D converter 113. The sub-stage STG12 is composed of a sub-D/A converter 114 and a sub-A/D converter 115. The sub-stage STG13 is composed of a sub-D/A converter 116 and a sub-A/D converter 117. The sub-stage STG14 is composed of only a sub-A/D converter 118.

The sample-and-hold circuit 111, and the sub-stages STG12 and STG14 are operated in response to a clock signal CLK. The sub-stages STG11 and STG13 are operated in response to an inverted signal that is a resultant of inversion of the clock signal CLK by an inverter 120. Namely, an even-numbered sub-stage and an odd-numbered sub-stage are operated in accordance with respective timings so as to have a phase difference of 180°. Each sub-A/D converter carries out the A/D conversion of the input signal of the sub-stage to which the sub-A/D converter belongs so as to determine a predetermined-numbered bit (the n-th bit (n: a predetermined number)) which is outputted to the sub-D/A converter of its sub-stage and the digital error correction circuit 119. Each sub-D/A converter determines an output voltage in accordance with the difference between an analog input signal voltage of the sub-stage and an analog voltage corresponding to the bit information that has been outputted from the sub-A/D converter, and the output voltage is outputted to the next sub-stage. Thus, each bit of the digital output is successively determined by the sub-stages STG11 through STG14, the error correction is carried out by the digital error correction circuit 119 so as to output a 4-bit digital signal.

FIG. 15 shows an example of the circuit configuration of the respective D/A converters. Each sub-D/A converter shown in FIG. 14 has a differential structure. However, for brevity, FIG. 15 shows a single ended circuit configuration. The sub-D/A converter shown in FIG. 15 has basically the same circuit configuration in which the SHA circuit shown in FIG. 13 is realized by a single ended circuit configuration. More specifically, operational amplifier stages 121 and 122 correspond to the operational amplifier stages 101 and 102, respectively. Capacitors 126 and 127 correspond to the capacitors 106p and 107p, respectively. A phase compensation capacitor 124 corresponds to the phase compensation capacitor 104p. Switches 125, 128, and 129 correspond to the switches 105p, 107p, and 109p, respectively.

In order to realize a 1-bit D/A converter, a switch 130 is connected with the terminal on the φh side of the switch 128 that should be made contacted during the hold phase φh so as to switch between the reference voltages +VREF and −VREF in accordance with the bit information from the sub-A/D converter. One of the terminals of the switch 129 is connected with the input terminal of the sub-D/A converter. Further provided is a switch 131 that cuts off an output terminal of the operational amplifier stage 122 from a ground voltage (GND voltage) during the hold phase φh. An output voltage of the operational amplifier stage 121 is applied to the operational amplifier stage 122 via an inverting amplifier stage 123 whose gain is equal to −1. Each one input terminal of the operational amplifier stages 121 and 122 is connected with the GND voltage.

According to the SHA circuit shown in FIG. 13, the operational amplifier stage 101 carries out the offset compensation during the sampling phase φs. However, the operational amplifier stage 102 of the next stage always consumes the power although it does not directly affect the operational proceeding. The power consumption of the operational amplifier stage 102 is more than several times of that of the operational amplifier stage 101. This causes the above power consumption to occupy most part of the power consumption of the SHA circuit.

SUMMARY OF THE INVENTION

The present invention is made in view of the foregoing problem, and its object is to provide a sample-and-hold amplifier circuit that can realize the low power consumption, and to provide pipelined A/D converter and pipelined D/A converter respectively using such a sample-and-hold amplifier circuit. In addition to the above object, it is another object of the present invention to make operate at a high speed each of the sample-and-hold amplifier circuit, the pipelined A/D converter, and the pipelined D/A converter.

In order to achieve the object, a sample-and-hold amplifier circuit in accordance with the present invention is provided with a sampling circuit that carries out the sampling of an input signal and an operational amplifier that carries out the operational amplification of the input signal that has been subjected to the sampling by the sampling circuit. The operational amplifier is further provided with first and second operational amplifier stages that are connected with each other in a series manner, a switch, provided between an output terminal of the first operational amplifier stage and an input terminal of the second operational amplifier stage, that connects or cuts off the connection of the first and second operational amplifier stages so as to be nonconductive in a first operation phase during which the sampling is carried out and so as to be conductive in a second operation phase during which the operational amplifier entirely carries out the operational amplification, and a phase compensation capacitor provided between an output terminal and the input terminal of the second operational amplifier stage.

With the arrangement, since the switch becomes nonconductive in the first operation phase, the output voltage of the second operational amplifier stage is not reset during the sampling. This allows that, during the first operation phase, the second operational amplifier stage carries out, together with the phase compensation capacitor, the holding operation of the voltage that has been subjected to the operational amplification in the second operation phase during which the switch is conductive (closed).

Thus, it is possible to use the power consumption of the second operational amplifier stage for the signal processing, in the first operation phase. Accordingly, it is possible to prolong the period of time during which the output signal is outputted from the sample-and-hold amplifier circuit. This is based on the fact that, when the sample-and-hold amplifier circuit is operated in response to the operation clock having a duty ratio of 50 percent, the period of time during which the output signal is outputted from the second operational amplifier stage becomes doubled compared with the conventional case. This indicates that it is possible to prolong the period of time for sending the signal that has been amplified by the sample-and-hold amplifier circuit to the next stage. Since the load is driven for a longer time, the low power consumption can be realized, accordingly. Further, it is possible to use the power consumption of the second operational amplifier stage for the signal processing, in the first operation phase. This causes the output voltage of the sample-and-hold amplifier circuit to vary a little when the frequency of the input signal is low. This allows to alleviate a slewing rate of the second operational amplifier stage and to realize the low power consumption.

As has been described above, it is possible to provide a sample-and-hold amplifier circuit that can realize the low power consumption.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description. The present invention will become more fully understood from the detailed description given hereinbelow and the accompanying drawings which are given by way of illustration only, and thus, are not limitative of the present invention.

DESCRIPTION OF THE EMBODIMENTS

Figure 1:
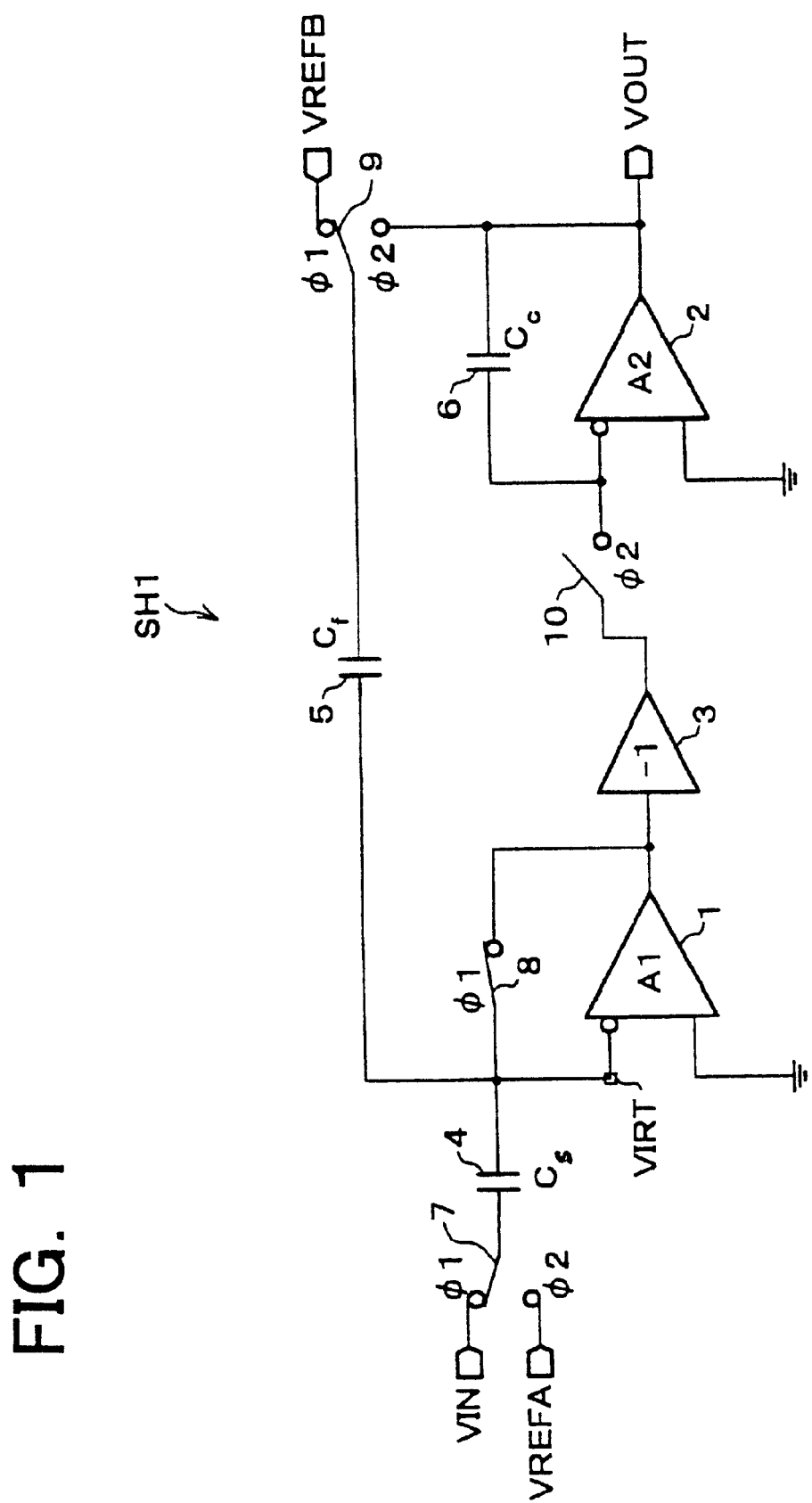
FIG. 1 is a block diagram showing a structure of a sample-and-hold amplifier circuit in accordance with the first embodiment of the present invention.
Figure 2:
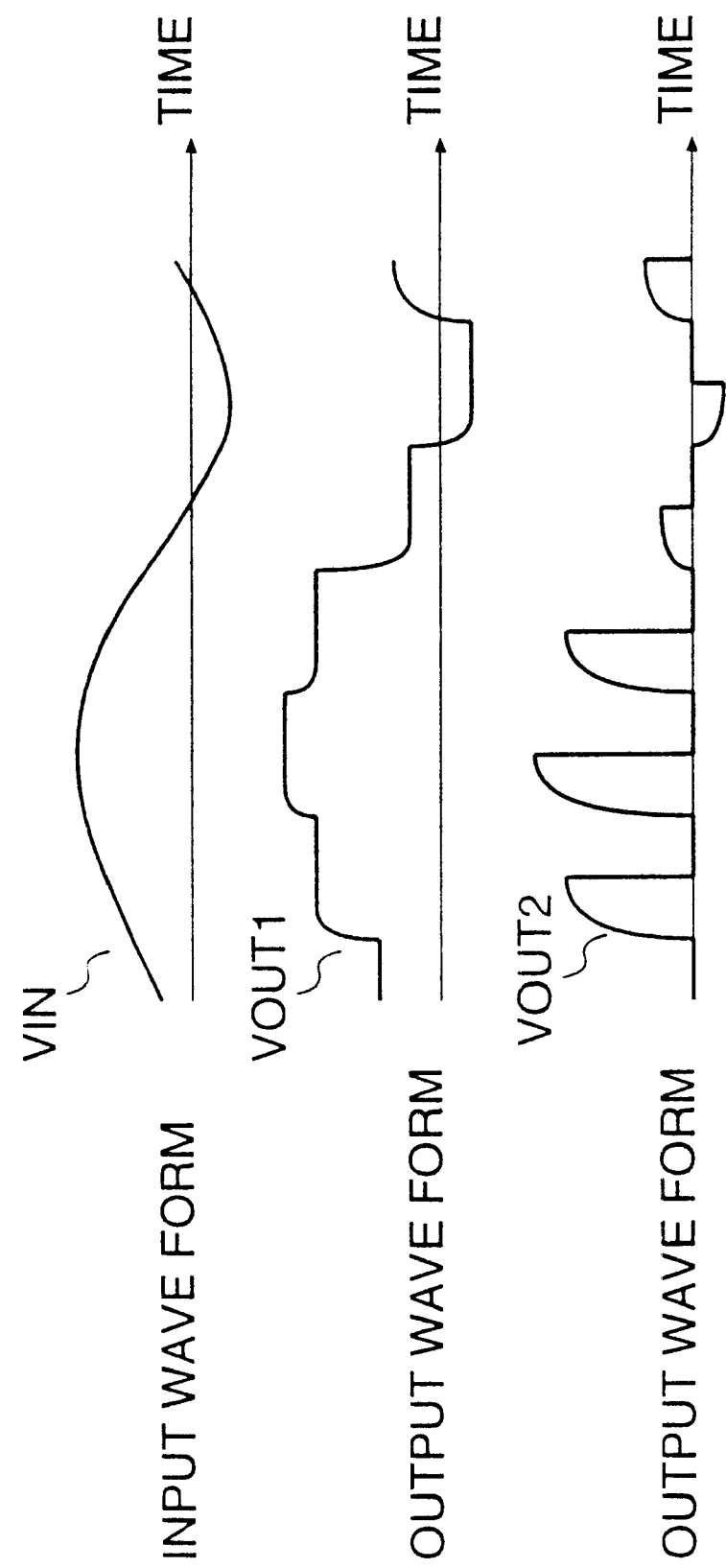
FIG. 2 is a wave form diagram showing the comparison of a relation between an input voltage and an output voltage of the sample-and-hold amplifier circuit of the present invention and that of a conventional one.
Figure 3:
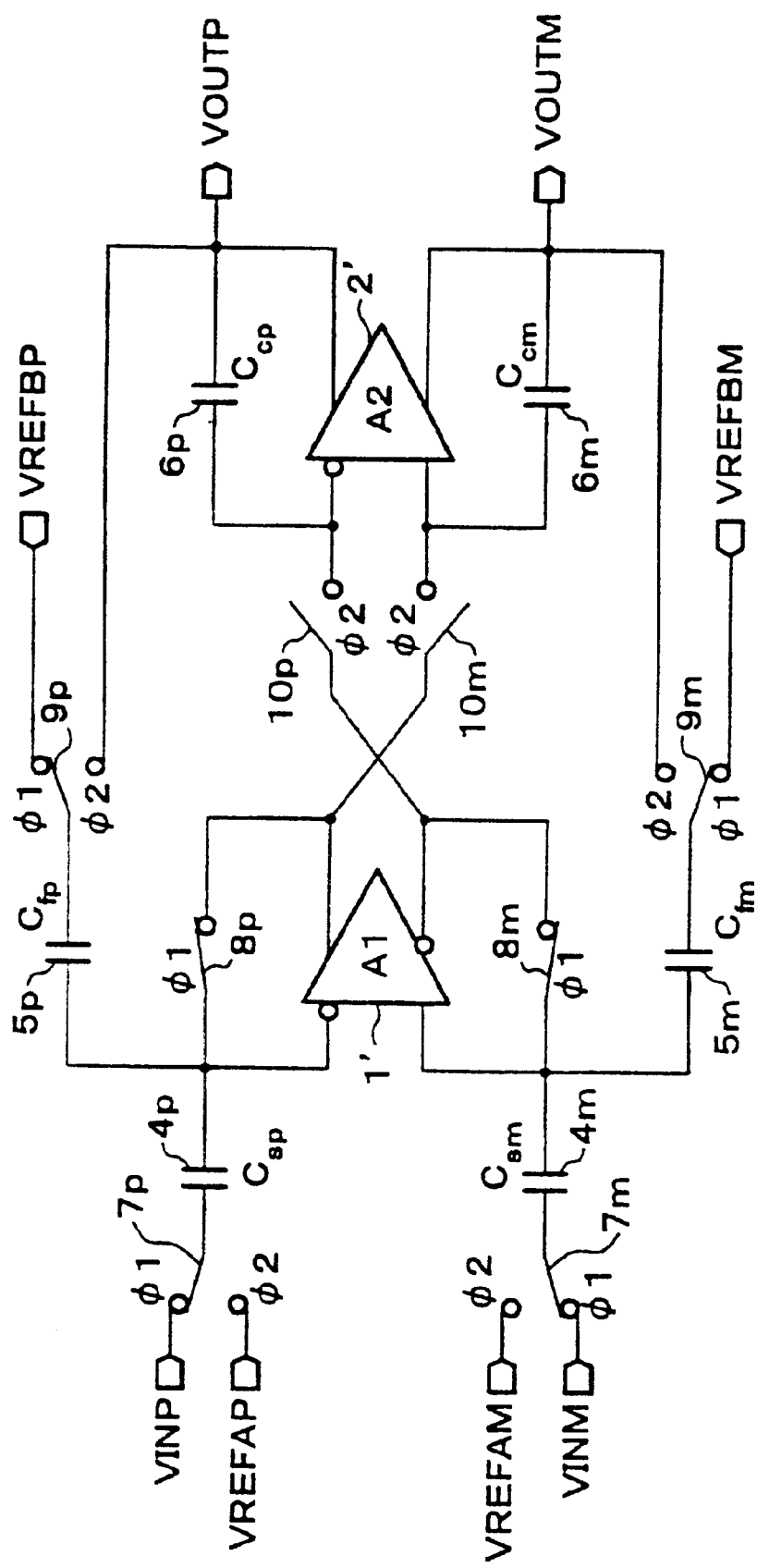
FIG. 3 is a block circuit diagram showing a modified example of the sample-and-hold amplifier circuit shown in FIG. 1.

The following description deals with the first embodiment of the present invention with reference to FIGS. 1 through 3. FIG. 1 shows a structure of an SHA circuit SH1 as a sample-and-hold amplifier circuit in accordance with the first embodiment. The SHA circuit SH1 is provided with operational amplifier stages 1 and 2, an inverting amplifier stage 3, capacitors 4 and 5, a phase compensation capacitor 6, switches 7 through 9, and a switch 10 that connects or cuts off the connection of the operational amplifier stages 1 and 2.

The operational amplifier stage 1 has a gain of A1, an inverted input terminal via which an output voltage of a circuit of the previous stage is inputted, and a noninverted input terminal to which a ground voltage (GND voltage) is applied. The operational amplifier stage 2 has a gain of A2, an inverted input terminal via which an output voltage of a circuit of the previous stage is inputted, and a noninverted input terminal to which the GND voltage is applied. The inverting amplifier stage 3 has a gain of −1, and inverts and outputs the output voltage of the operational amplifier stage 1. The capacitor 4 has a capacitance of $C_s$, and is provided between an input terminal of the SHA circuit SH1 and the inverted input terminal of the operational amplifier stage 1. The capacitor 4 carries out the sampling of the input signal, that has been inputted via the input terminal, based on a voltage VIN (a voltage of the input signal). The capacitor 5 has a capacitance of $C_f$, and is provided between the output terminal of the operational amplifier stage 2 (the output terminals of the respective operational amplifier and the SHA circuit SH1) and the inverted input terminal of the operational amplifier 1. The capacitor 5 causes that the output voltage VOUT which is an output voltage of the SHA circuit SH1 is subjected to the negative feedback to the operational amplifier 1. The phase compensation capacitor 6 has a capacitance of $C_c$ and is provided between the inverted input terminal (input terminal) and the output terminal (the output terminals of the respective operational amplifier and the SHA circuit SH1) of the operational amplifier stage 2. The phase compensation capacitor 6 compensates the deterioration of phase margin occurred when the operational amplifier stages 1 and 2 are connected with each other in a series manner.

Each of the switches 7 through 9 and the switch 10 is realized by analog switches. The switch 7 is provided so as to be closer to the input terminal of the SHA circuit SH1 than the capacitor 4. The switch 7 (a) connects the capacitor 4 with the input terminal via which the voltage VIN is applied during the first operation phase $\phi 1$ and (b) connects the capacitor 4 with a reference voltage terminal via which a reference voltage VREFA is applied during the second operation phase $\phi 2$ (later described). The switch 8 is provided between the inverted input terminal and the output terminal of the operational amplifier stage 1 so as to be connected with the operational amplifier stage 1 in a parallel manner. The switch 8 is conductive during the first operation phase $\phi 1$ so as to short-circuit the inverted input and output terminals of the operational amplifier stage 1, and is nonconductive during the second operation phase $\phi 2$ so as to cut off the connection of the inverted input terminal and the output terminal.

The switch 9 is provided between the capacitor 5 and the output terminal of the SHA circuit SH1. The switch 9 (a) connects the capacitor 5 with a reference voltage terminal via which a reference voltage VREFB is applied to the capacitor 5 during the first operation phase $\phi 1$ and (b) connects the capacitor 5 with the output terminal of the SHA circuit SH1 during the second operation phase $\phi 2$ (later described). The switch 10 is provided between the output terminal of the inverting amplifier stage 3 and a connecting point which connects the input terminal of the operational amplifier stage 2 with the phase compensation capacitor 6. The switch 10 (a) is nonconductive so as to cut off the connection of the connecting point and the output terminal of the inverting amplifier stage 3 during the first operation phase $\phi 1$ and (b) is conductive so as to connect the connecting point and the output terminal of the inverting amplifier stage 3 during the second operation phase $\phi 2$.

The following description deals with the operation of the SHA circuit SH1 having the foregoing circuit configuration. The operation of the SHA circuit SH1 includes the first operation phase $\phi 1$ during which the input signal is subjected to the sampling and the second operation phase $\phi 2$ during which the voltage thus sampled is subjected to the operational amplification by the operational amplifier stages 1 and 2. The SHA circuit SH1 is divided into two circuits during the first operation phase φ1. One of them is a circuit that carries out the sampling of the input signal and is provided with the operational amplifier stage 1, the capacitors 4 and 5, and the switches 7 through 9. Another one is a sample-and-hold circuit that is provided with the operational amplifier stage 2 and the phase compensation capacitor 6. On the other hand, during the second operation phase φ2, the operational amplifier stages 1 and 2, the inverting amplifier stage 3, and the phase compensation capacitor 6 constitute, as a whole, a single operational amplifier. Such a single operational amplifier carries out the operation and the amplification with respect to the input signal that has been subjected to the sampling during the first operation phase φ1.

During the first operation phase φ1, the switch 7 is switched so that the SHA circuit SH1 receives the voltage VIN via its input terminal, the switch 8 is switched so that the input terminal is connected with the output terminal in the operational amplifier stage 1, and the switch 9 is switched so that the reference voltage VREFB is applied to the capacitor 5 via the reference voltage terminal. The switch 10 is nonconductive. With the switchings, the voltage, of a node VIRT whose electric potential is equal to that of the inverted input terminal of the operational amplifier stage 1, becomes an offset voltage VOFF1 of the operational amplifier stage 1. This results in that the electrical charges of $C_s \times (\text{VIN} - \text{VOFF1})$ and $C_f \times (\text{VREFB} - \text{VOFF1})$ are stored by the capacitors 4 and 5, respectively.

During the second operation phase φ2, the switch 7 is switched so that the SHA circuit SH1 receives the reference voltage VREFA via the reference voltage terminal, the switch 8 is switched so that the connection of the input terminal and the output terminal is cut off in the operational amplifier stage 1, and the switch 9 is switched so that the output terminal of the SHA circuit SH1 and the inverted input terminal of the operational amplifier stage 1 are connected via the capacitor 5. The switch 10 is conductive so as to connect the output terminal of the inverting amplifier stage 3 with a connecting point which connects the input terminal of the operational amplifier stage 2 with the phase compensation capacitor 6. With the switchings, the operational amplifier stages 1 and 2, the inverting amplifier stage 3, and the phase compensation capacitor 6 constitute, as a whole, a single operational amplifier so as to amplify the input signal in accordance with an amplification factor determined by the ratio of $C_s$ and $C_f$. In this case, the output voltage VOUT, expressed by the following equation (1), is outputted via the output terminal of the operational amplifier stage 2.

$$\text{VOUT} = (C_s/C_f)(\text{VIN} - \text{VREFA}) + \text{VREFB} \quad (1)$$

Further, during the second operation phase φ2, the voltage VOUT expressed by the above equation (1) is outputted via the output terminal of the operational amplifier stage 2, and simultaneously, the electrical charges ($C_c \times \text{VOUT}$) that varies depending on the voltage VOUT are stored by the phase compensation capacitor 6, thereby carrying out the sampling. During the next first operation phase φ1, the switch 10 is conductive so that the connection, of the output terminal of the inverting amplifier stage 3 and the connecting point which connects the input terminal of the operational amplifier stage 2 and the phase compensation capacitor 6, is cut off. Accordingly, the voltage VOUT expressed by the equation (1) is held at the output terminal of the operational amplifier stage 2 by the sample-and-hold circuit that is constituted by the operational amplifier stage 2 and the phase compensation capacitor 6. At this time, the operational amplifier stage 1 is reset in response to the switch 8, and simultaneously, the capacitors 4 and 5 carry out the samplings of the next voltage VIN and the reference voltage VREFB in response to the switches 7 and 9, respectively.

The above operations are repeated, thereby resulting in that the SHA circuit SH1 carries out the operation of the sample-and-hold amplifier operation. When the voltage VIN (analog input) has a wave form shown in FIG. 2, the voltage VOUT has a wave form shown as VOUT1 (analog output). This shows the result that the SHA circuit SH1 have held the same voltage at its output terminal for a long period of time.

Thus, the power consumption of the operational amplifier stage 2 (the second stage) can be used for processing of the signals during the first operation phase φ1. Accordingly, when the SHA circuit SH1 is operated in response to the operation clock having a duty ratio of 50 percent, the period of time during which the output signal is outputted from the operational amplifier stage 2 becomes doubled compared with the conventional case (see FIG. 13). This indicates that it is possible to prolong the period of time for sending the signal that has been amplified by the SHA circuit SH1 to the next stage. Since the load is driven for a longer time, the low power consumption can be realized, accordingly. Further, it is possible to use the power consumption of the second operational amplifier stage (the second) for the signal processing, in the first operation phase φ1. This causes the output voltage VOUT of the SHA circuit SH1 to vary a little (see FIG. 2), when the frequency of the input signal (i.e., the voltage VIN) is low. This allows to alleviate a slewing rate of the operational amplifier stage 2 and to realize the low power consumption. On the other hand, according to the conventional circuit configuration shown in FIG. 13, the output voltage of the SHA circuit becomes zero because it is reset. This causes the voltage to greatly vary. This requires to provide an operational amplifier having a great slewing rate.

The reference voltage terminal connected with the switch 9 shown in FIG. 1 is provided for applying the reference voltage VREFB. The present invention, however, is not limited to this. Alternatively, the voltage VIN may be applied via the reference voltage terminal. According to the circuit configuration shown in FIG. 1, the offset compensation is carried out with respect to the operational amplifier stage 1, however, the present invention is not limited to this. The circuit configuration in which no offset compensation is carried out can be realized with ease based on FIG. 1.

The SHA circuit SH1 shown in FIG. 1 is realized by a single ended circuit. The SHA circuit SH1 may be realized by an entire differential circuit in which operational amplifier stages are of differential input and output configurations. An SHA circuit SH2 which is realized by such an entire differential circuit is shown in FIG. 3. Voltages VINP and VINM correspond to the voltage VIN. Reference voltages VREFAP and VREFAM correspond to the reference voltage VREFA. Reference voltages VREFBP and VREFBM correspond to the reference voltage VREFB. Voltages VOUTP and VOUTM correspond to the voltage VOUT. Operational amplifier stages 1' and 2' correspond to the operational amplifier stages 1 and 2 shown in FIG. 1. In FIG. 3, the inverting amplifier 3 shown in FIG. 1 is realized (a) by connecting a noninverted output terminal of the operational amplifier stage 1' with a noninverted input terminal of the operational amplifier stage 2' and (b) by connecting an inverted output terminal of the operational amplifier stage 1' with an inverted input terminal of the operational amplifier stage 2'. Accordingly, it is not necessary to separately provide an inverting amplifier stage. Note that since the members whose reference numerals are added by "p" and "m" have the same functions as those shown in FIG. 1, the description thereof is omitted. Note also that (a) the voltages VINP and VINM may be substituted for the reference voltages VREFBP and VREFBM, respectively and (b) a circuit may be configured so that no offset compensation is carried out. These (a) and (b) are similar to the foregoing description.

Second Embodiment

Figure 4:
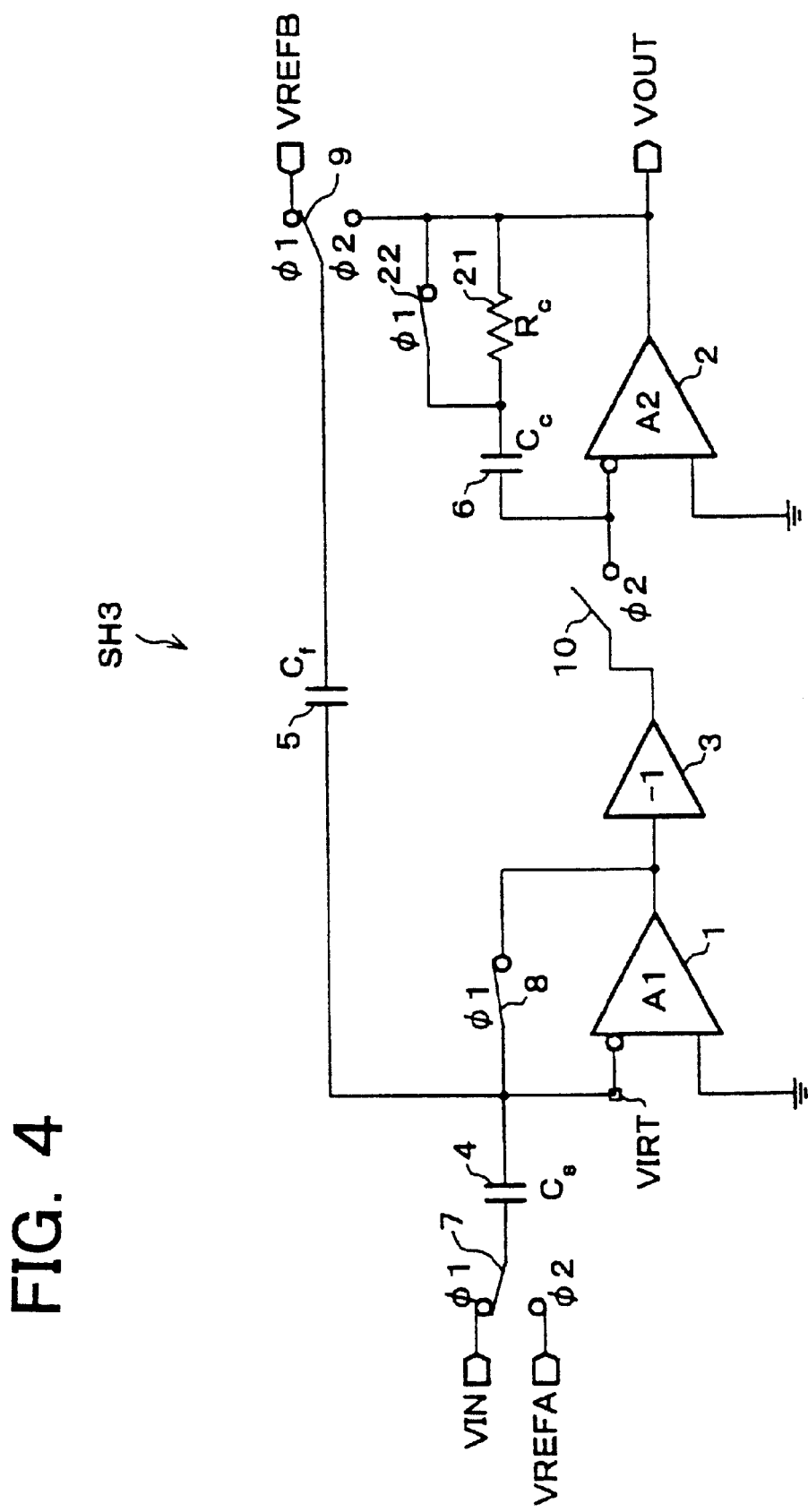
FIG. 4 is a block circuit diagram showing a structure of a sample-and-hold amplifier circuit in accordance with the second embodiment of the present invention.
Figure 5:
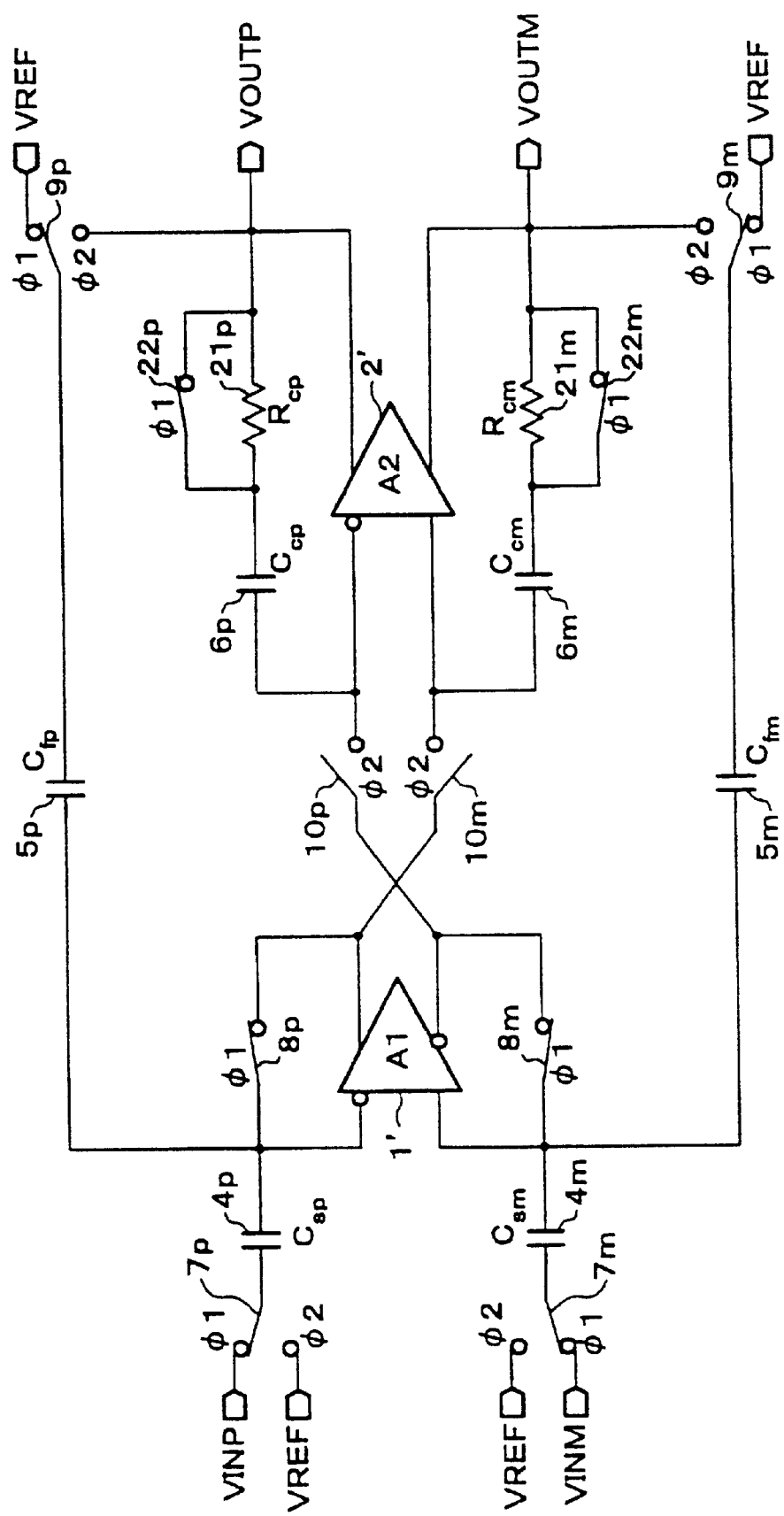
FIG. 5 is a block circuit diagram showing a modified example of the sample-and-hold amplifier circuit shown in FIG. 4.

The following description deals with the second embodiment of the present invention with reference to FIGS. 4 and 5. Note that the circuit elements that have the same functions as those of the foregoing first embodiment have the same reference numerals, respectively, and the description thereof is omitted.

FIG. 4 shows the structure of an SHA circuit SH3 in accordance with the second embodiment functioned as a sample-hold-amplifier circuit. The SHA circuit SH3 is provided with operational amplifier stages 1 and 2, an inverting amplifier stage 3, capacitors 4 and 5, a phase compensation capacitor 6, switches 7 through 9, a switch 10 that connects or cuts off the connection of the operational amplifier stage, a phase compensation resistor 21, and a switch 22 that short-circuits the phase compensation resistor 21.

The phase compensation resistor 21 has a resistance value of $R_c$, and is provided between an output terminal (an output terminal of the operational amplifier and the SHA circuit SH3) and an inverting input terminal of the operational amplifier stage 2 so as to be connected with the phase compensation capacitor 6 in a series manner. The phase compensation resistor 21, together with the phase compensation capacitor 6, compensates the deterioration of the phase margin that occurs when the operational amplifier stages 1 and 2 are connected with each other in a series manner. The switch 22 is realized by an analog switch and is provided so as to be connected with the phase compensation resistor 21 in a parallel manner. The switch 22 is conductive during the first operation phase φ1 so as to short-circuit the phase compensation resistor 21, and is nonconductive during the second operation phase φ2.

The operational amplifier stage 2, the phase compensation capacitor 6, and the phase compensation resistor 21 constitute a sample-and-hold circuit during the first operation phase φ1, like the first embodiment. In this case, since the switch 22 is conductive, it is possible to suppress the deterioration of the settling characteristic due to the pole caused by the phase compensation resistor 21. This allows that the voltage VOUT is promptly converged, thereby ensuring the high speed operation. Note that when the deterioration of the settling characteristic due to the pole caused by the phase compensation resistor 21 can be ignored, it is not necessary to provide the switch 22. According to the second embodiment, the phase compensation capacitor 6 is connected with the input terminal of the operational amplifier stage of the following stage, and the phase compensation resistor 21 is connected with the output terminal of the operational amplifier stage of the following stage. The present invention, however, is not limited to this. In a reverse manner, the phase compensation capacitor 6 may be connected with the output terminal of the operational amplifier stage of the following stage, and the phase compensation resistor 21 may be connected with the input terminal of the operational amplifier stage of the following stage, respectively. Note that since the operation of the SHA circuit SH3 is similar to the SHA circuit SH1, the description thereof is omitted here.

Although the SHA circuit SH3 is realized by a single ended circuit, an entire differential circuit can be easily configured based on FIG. 4. FIG. 5 shows an SHA circuit SH4 which is realized by the entire differential circuit. The reference numerals assigned to the members and the voltages shown in FIGS. 4 and 5 correspond to those of the first embodiment. In the circuit configurations of FIGS. 4 and 5, the offset compensation is carried out with respect to the operational amplifier stages 1 and 1'. A circuit configuration in which no offset compensation is carried out may be realized with ease based on FIGS. 4 and 5.

Further, in the SHA circuit SH3 shown in FIG. 4 and in the SHA circuit SH4 shown in FIG. 5, the resistor between source and drain of the MOS transistor or the resistor between emitter and collector of the bipolar transistor may be substituted for the respective phase compensation resistors 21, 21p, and 21m.

Third Embodiment

Figure 6:
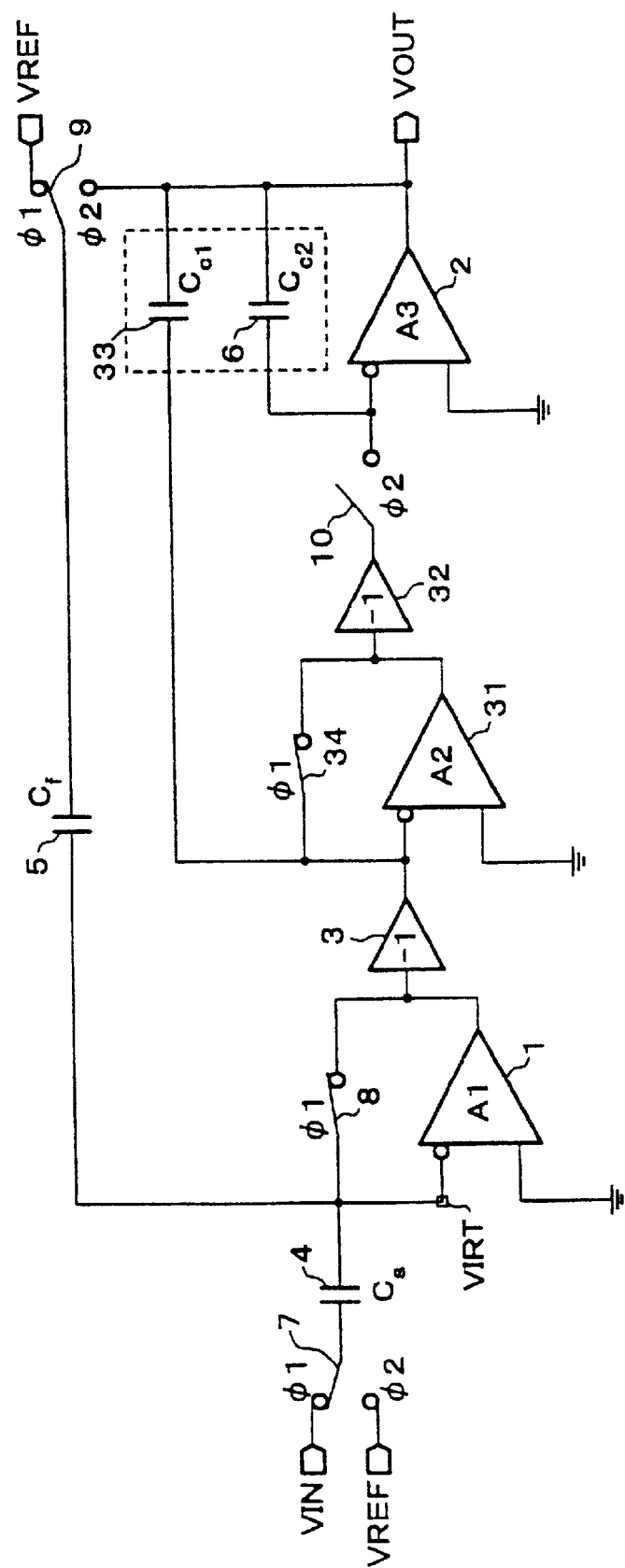
FIG. 6 is a block circuit diagram showing a structure of a sample-and-hold amplifier circuit in accordance with the third embodiment of the present invention.
Figure 7:
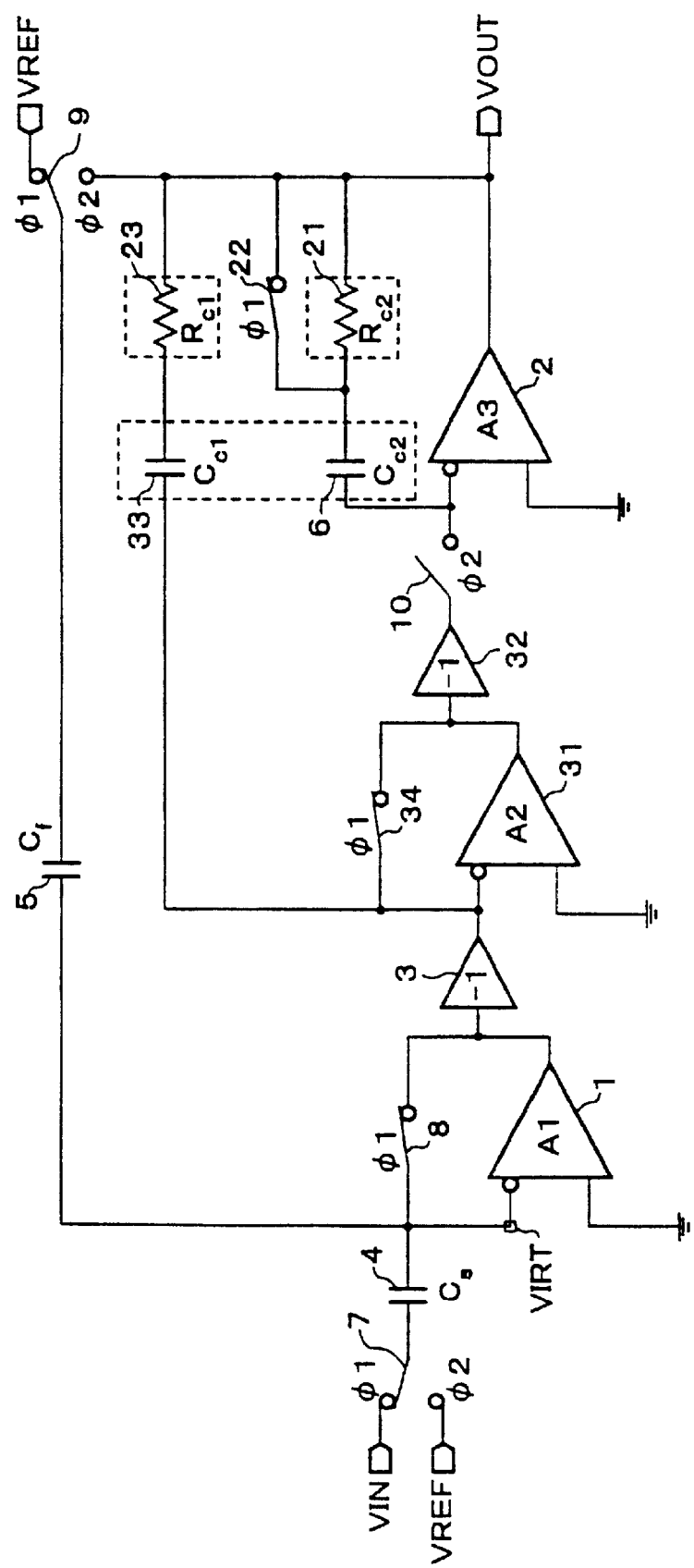
FIG. 7 is a block circuit diagram showing a structure of another sample-and-hold amplifier circuit in accordance with the third embodiment of the present invention.
Figure 8:
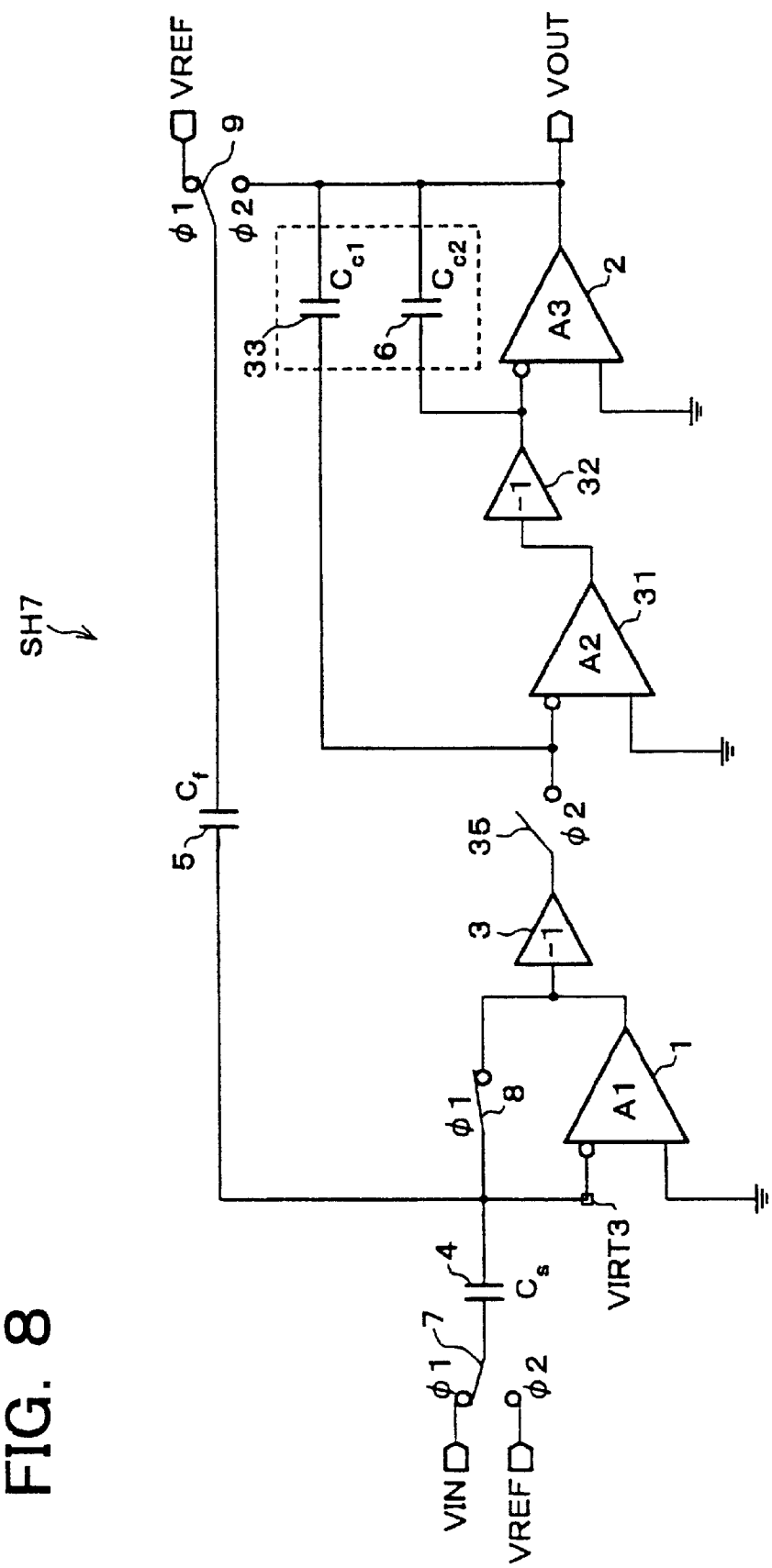
FIG. 8 is a block diagram showing a structure of a further sample-and-hold amplifier circuit in accordance with the third embodiment of the present invention.

The following description deals with the third embodiment of the present invention with reference to FIGS. 6 through 8. Note that the circuit elements, that have the same functions as those of the foregoing first and second embodiment, have the same reference numerals, respectively, and the description thereof is omitted.

FIG. 6 shows the structure of an SHA circuit SH5 functioned as a sample-hold-amplifier circuit. The SHA circuit SH5 is provided with operational amplifier stages 1, 2, and 31, inverting amplifier stages 3 and 32, capacitors 4 and 5, phase compensation capacitors 6 and 33, switches 7 through 9 and 34, and a switch 10 that connects or cuts off the connection of the operational amplifier stage.

In the operational amplifier stage 31, an inverted input terminal is connected with an output terminal of the inverting amplifier stage 3, and the GND voltage is applied to an noninverted input terminal. An input terminal of the inverting amplifier stage 32 is connected with an output terminal of the operational amplifier stage 31. The output terminal is connected with the switch 10. The switch 34 is realized by an analog switch, and is provided between the inverted input terminal and the output terminal of the operational amplifier stage 31 in a parallel manner. The switch 34 is conductive during the first operation phase φ1 so that the inverted input terminal and the output terminal of the operational amplifier stage 31 are short-circuited. The switch 34 is nonconductive during the second operation phase φ2 so as to cut off the connection of the inverted input terminal and the output terminal of the operational amplifier stage 31. The phase compensation capacitor 33 is provided so as to connect the inverted input terminal (input terminal) of the operational amplifier stage 31 with the output terminal (the output terminal of the operational amplifier and the SHA circuit SH5) of the operational amplifier stage 2. The phase compensation capacitor 33 and the phase compensation capacitor 6 constitute a phase compensation capacitor group (the part enclosed by the dashed line shown in FIG. 6). The phase compensation capacitor 33 compensates the deterioration occurred when the operational amplifier stages 1, 31, and 2 are connected in a series manner. Note that, for convenience, A1, A2, and A3 are indicative of the gains of the respective operational amplifier stages 1, 31, and 2 so as to show the connecting order of the operational amplifier stages 1, 31, and 2. The capacities of the respective compensation capacitors 6 and 33 are indicated as $C_{c1}$ and $C_{c2}$, respectively.

The SHA circuit SH5 basically carries out the same operation as that of the SHA circuit SH1 shown in FIG. 1. The difference therebetween resides in the following points. During the first operation phase φ1, the operational amplifier stages 1 and 31 are reset so that the capacitors 4 and 5 carry out the sampling of the input signal and the reference voltage VREF, respectively. In this case, the switch 10 is nonconductive so as to cut off the connection of the connecting point which connects the compensation capacitor 6 with the inverted input terminal of the operational amplifier stage 2 and the output terminal of the inverting amplifier stage 32. Accordingly, the operational amplifier stage 2 and the compensation capacitor 6 constitute a sample-and-hold circuit, and carries out the sampling during the first operation phase φ1 and carries out the holding of the voltage that has been amplified during the second operation phase φ2. On the other hand, during the second operation phase φ2, the operational amplifier stages 1, 31, and 2, the inverting amplifier stages 3 and 32, and the phase compensation capacitors 6 and 33 function, as a whole, as a single amplifier. Such a single amplifier carries out the amplification and the calculation with respect to the input signal that has been subjected to the sampling during the first operation phase φ1.

Since the switch 10 is thus nonconductive during the first operation phase φ1, the output voltage of the operational amplifier stage 2 following the switch 10 is not reset. During the first operation phase φ1, the operational amplifier stage 2, together with the phase compensation capacitor 6, carries out the holding of the voltage that has been subjected to the operational amplification during the second operation phase φ2 in which the switch 10 is conductive.

With the operation, it is possible to use the power consumption of the operational amplifier stage 2 that follows the switch 10 during the first operation phase φ1. Accordingly, when the SHA circuit SH5 is operated in response to the operation clock having a duty ratio of 50 percent, the period of time during which the output signal is outputted from the operational amplifier stage 2 becomes doubled compared with the conventional case. This indicates that it is possible to prolong the period of time for outputting of the SHA circuit SH5. Namely, this indicates that it is possible to prolong the time period for sending the signal that has been amplified by the SHA circuit SH5 to the next stage. Since the load is driven for a longer time, the low power consumption can be realized, accordingly. Further, it is possible to use the power consumption of the operational amplifier stage 2 for the signal processing, during the first operation phase φ1. This causes the output voltage VOUT of the SHA circuit SH5 to vary a little, when the frequency of the input signal (i.e., the voltage VIN) is low. This allows to alleviate a slewing rate of the operational amplifier stage 2 and to realize the low power consumption. As has been discussed above, even in the circuit configuration which includes the multiple operational amplifier stages, it is possible to provide a sample-and-hold amplifier circuit capable of realizing the low power consumption.

FIG. 7 shows the circuit configuration of an SHA circuit SH6 functioning as another sample-and-hold amplifier circuit in accordance with the present embodiment. The SHA circuit SH6 has a circuit configuration in which a switch 22 that short-circuits the phase compensation resistor and phase compensation resistors 21 and 23 are further provided in the SHA circuit SH5.

The phase compensation resistor 21 and the switch 22 are the same as those of the second embodiment. The phase compensation resistor 23 is provided between the inverted input terminal (input terminal) of the operational amplifier stage 31 and the output terminal (the output terminal of the operational amplifier and the SHA circuit SH6) of the operational amplifier stage 2 so as to be connected with the phase compensation capacitor 33 in a series manner. The phase compensation resistors 21 and 23, together with the phase compensation capacitors 6 and 33, compensate the deterioration occurred when the operational amplifier stages 1, 31, and 2 are connected in a series manner.

With the circuit configuration, in the SHA circuit SH6, like the second embodiment, it is possible to suppress the deterioration of the settling characteristic caused by the phase compensation resistor 21. This ensures the high speed operation. When the deterioration of the settling characteristic can be ignored, it is not necessary to provide the switch 22. This is similar to the second embodiment. Note that since the operation of the SHA circuit SH6 is similar to that of the SHA circuit SH5, the description thereof is omitted here.

Further, in the SHA circuit SH6 shown in FIG. 7 the resistor between source and drain of the MOS transistor or the resistor between emitter and collector of the bipolar transistor may be substituted for the respective phase compensation resistors 21 and 23.

FIG. 8 shows the circuit configuration of an SHA circuit SH7 functioning as a further sample-and-hold amplifier circuit in accordance with the present embodiment. Instead of the switch 10 of the SHA circuit SH5 shown in FIG. 6, the SHA circuit SH7 has a circuit configuration in which (a) a switch 35 that connects or cuts off the connection of the operational amplifier stage is provided between the output terminal of the inverting amplifier stage 3 and the inverted input terminal of the operational amplifier stage 31 and (b) the switch 34 of the SHA circuit SH5 is removed. Note that the phase compensation resistors 21 and 23 of the SHA circuit SH6 shown in FIG. 7 may be separately provided. In this case, a switch that short-circuits the phase compensation resistor should be provided so as to be connected with the phase compensation resistor 23, in a parallel manner, that is provided between the output terminal of the operational amplifier stage 2 and the inverted input terminal (input terminal) of the operational amplifier stage 31.

The operation of the SHA circuit SH7 carries out the same operation as that of the SHA circuit SH1 shown in FIG. 1. The following description deals with the points that are different from the circuit configuration shown in FIG. 1. During the first operation phase φ1, the operational amplifier stage 1 is reset so that the capacitors 4 and 5 carry out the sampling of the input signal and the reference voltage VREF, respectively. In this case, the switch 35 is nonconductive so as to cut off the connection of the connecting point which connects the compensation capacitor 33 with the inverted input terminal of the operational amplifier stage 31 and the output terminal of the inverting amplifier stage 3. Accordingly, (a) the operational amplifier stages 31 and 2 and (b) the compensation capacitors 33 and 6 constitute a sample-and-hold circuit, and carries out the sampling during the previous first operation phase φ1 and carries out the holding of the voltage that has been amplified during the second operation phase φ2. On the other hand, during the second operation phase φ2, the operational amplifier stages 1, 31, and 2, the inverting amplifier stages 3 and 32, and the phase compensation capacitors 6 and 33 function, as a whole, as a single amplifier. Such a single amplifier carries out the amplification and the calculation with respect to the input signal that has been subjected to the sampling during the first operation phase φ1.

Since the switch 35 is thus nonconductive during the first operation phase φ1, the output voltages of the respective operational amplifier stages 31 and 2 are not reset. During the first operation phase φ1, the operational amplifier stages 31 and 2, together with the phase compensation capacitors 33 and 6, carry out the holding of the voltage that has been subjected to the operational amplification during the second operation phase φ2 in which the switch 35 is conductive.

With the operation, it is possible to use the power consumption of the operational amplifier stages 31 and 2 that follows the switch 35 during the first operation phase φ1. Accordingly, when the SHA circuit SH7 is operated in response to the operation clock having a duty ratio of 50 percent, the period of time during which the output signal is outputted from the operational amplifier stage 2 becomes doubled compared with the conventional case. This indicates that it is possible to prolong the period of time for outputting of the SHA circuit SH7. Namely, this indicates that it is possible to prolong the time period for sending the signal that has been amplified by the SHA circuit SH7 to the next stage. Since the load is driven for a longer time, the low power consumption can be realized, accordingly. Further, it is possible to use the power consumption of the operational amplifier stages 31 and 2 for the signal processing, during the first operation phase φ1. This causes the output voltage of the operational amplifier stage 31 and the output voltage of the operational amplifier stage 2 (the voltage VOUT of the SHA circuit SH7) to vary a little, when the frequency of the input signal is low. This allows to alleviate a slewing rate of the operational amplifier stages 31 and 2 and to realize the low power consumption. As has been discussed above, even in the circuit configuration which includes a plurality of operational amplifier stages of not less than 3 stages, it is possible to provide a sample-and-hold amplifier circuit capable of realizing the low power consumption.

The foregoing effects are not limited to the operational amplifier which includes the first through third operational amplifier stages like the SHA circuits SH5, SH6, and SH7, and are not also limited to the case where the first and second operational amplifier stages are provided like the first and second embodiment. It is generally possible to obtain the above same effects by the circuit configuration in which (a) multiple operational amplifier stages that are connected with each other in a series manner, (b) a switch (like the foregoing switch) that connects or cuts off the connection of the operational amplifier stage and is provided between one pair of the neighboring two operational amplifier stages, i.e., a previous operational amplifier stage and an operational amplifier stage following the previous operational amplifier stage, so as to be provided between the output terminal of the previous operational amplifier stage and an inverted input terminal (input terminal) of the operational amplifier stage following the previous operational amplifier stage, and (c) phase compensation capacitors provided between the output terminal of the final operational amplifier stage and at least input terminals of the respective operational amplifier stages following the switch.

Further, it is possible to further provide, in the circuit configuration which includes the multiple operational amplifier stages, (a) phase compensation resistors that are provided between the output terminal of the final operational amplifier stage and the input terminals of the respective operational amplifier stages following the switch so as to be connected with the respective phase compensation capacitors in a series manner and (b) switches that short-circuit the respective phase compensation resistors so as to suppress the deterioration of the settling characteristic caused by the phase compensation resistors. In this case, the switch that short-circuits the respective phase compensation resistor is connected, in a parallel manner, with the phase compensation resistor which is connected, in a series manner, with the phase compensation capacitor that is provided between the output terminal of the final operational amplifier stage and the inverted input terminal (input terminal) of the operational amplifier that follows the switch.

The SHA circuits SH5, SH6, and SH7 shown in FIGS. 6 through 8 are respective single ended circuits. However, it is easy to realize the circuits by differential circuits, respectively, based on FIGS. 6 through 8, like the first and second embodiment. Further, it is possible to easily realize a circuit configuration in which no offset compensation is carried out with respect to the operational amplifier stages.

Fourth Embodiment

Figure 9:
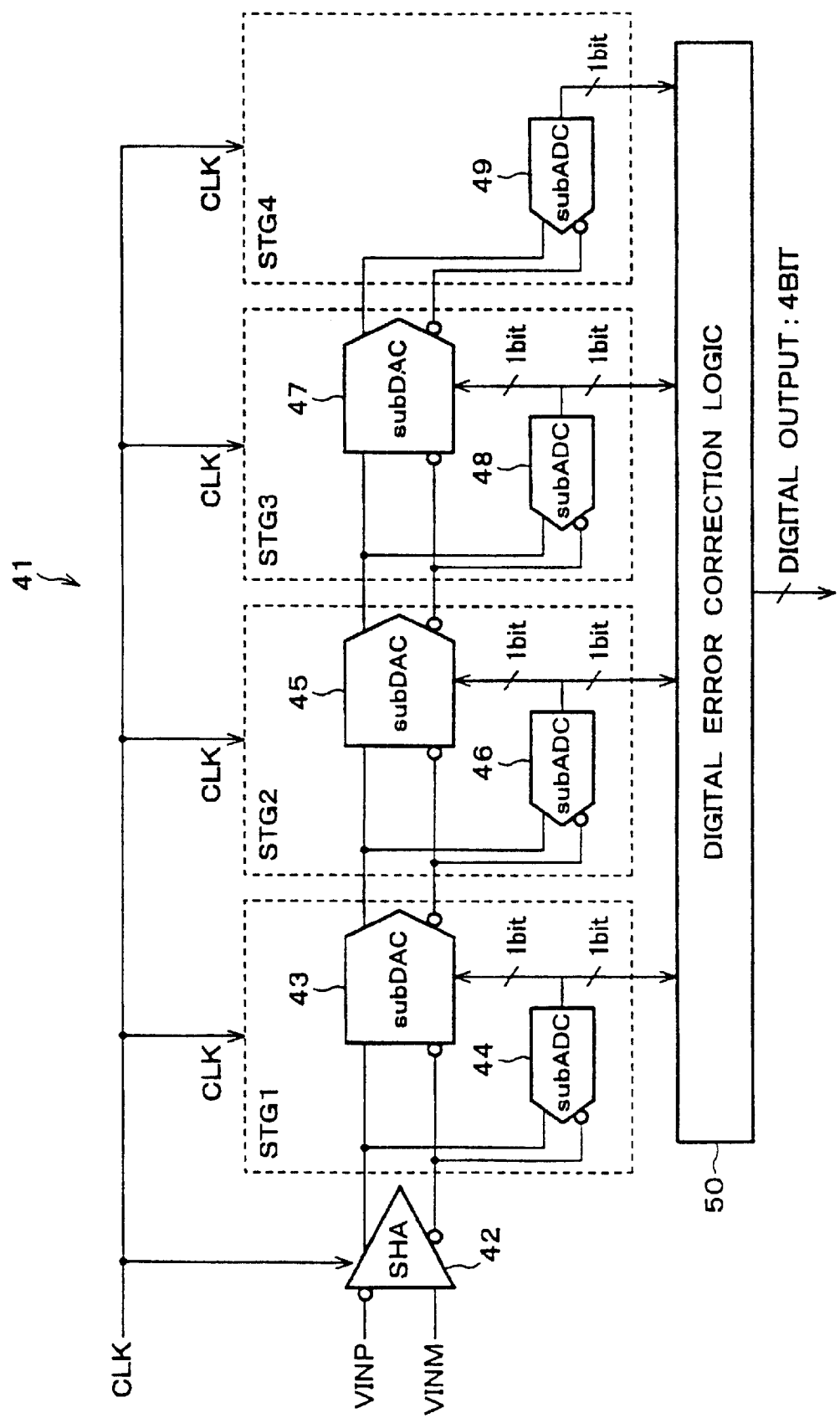
FIG. 9 is a block diagram showing a structure of a pipelined A/D converter in accordance with the fourth embodiment of the present invention.
Figure 10:
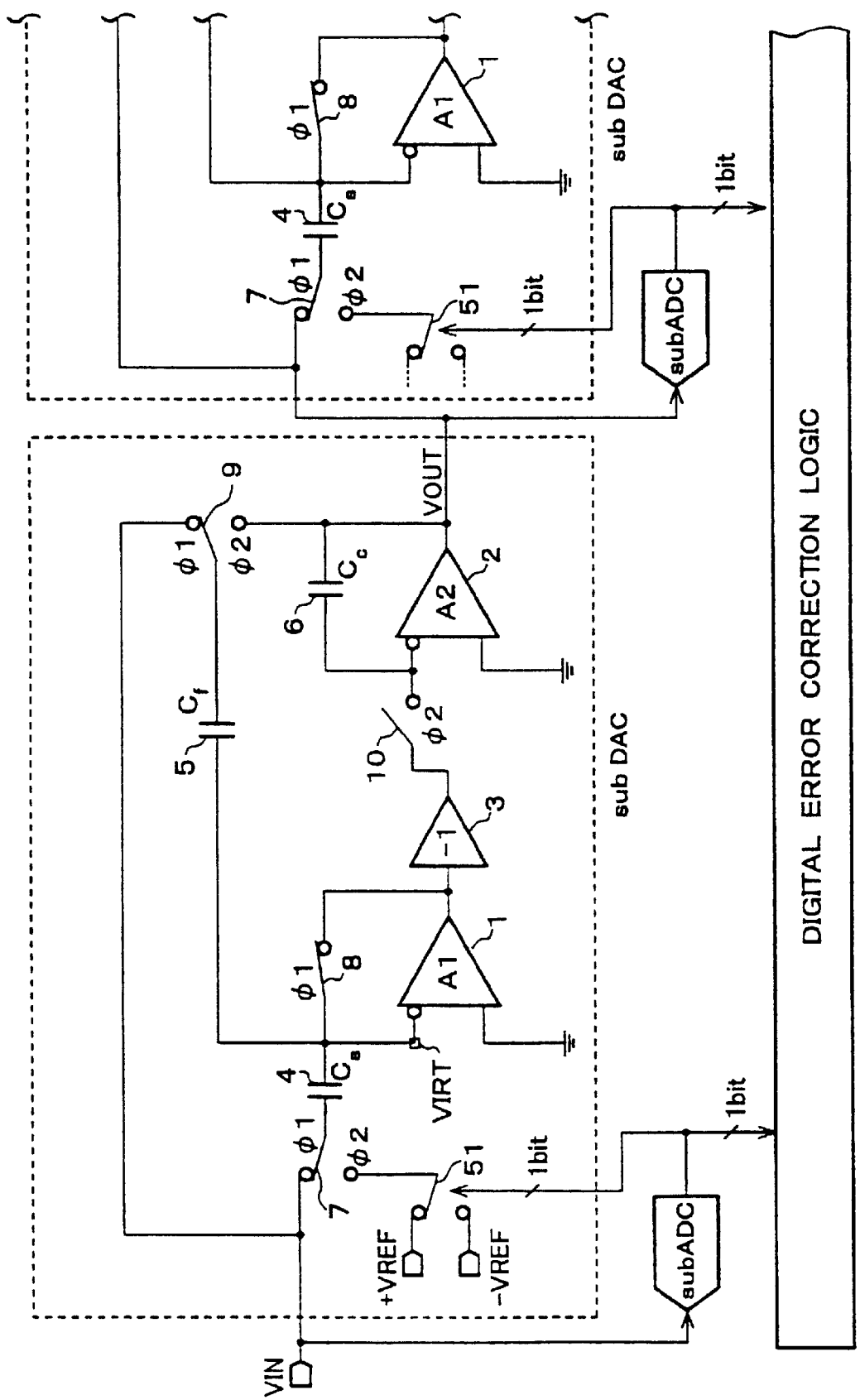
FIG. 10 is a circuit block diagram showing a structure of a sub-operational-circuit for use in the pipelined A/D converter shown in FIG. 10.

The following description deals with the fourth embodiment of the present invention with reference to FIGS. 9 and 10. Note that the circuit elements that have the same functions as those of the foregoing first through third embodiment have the same reference numerals, respectively, and the description thereof is omitted.

FIG. 9 shows the structure of a pipelined A/D converter 41. The pipelined A/D converter 41 is a 4-bit pipelined A/D converter. The pipelined A/D converter 41 is provided with (a) a sample-and-hold circuit 42, (b) a plurality of sub-stages STG1, STG2, and STG3 as a first sub-A/D converter block, (c) a sub-stage STG4 as a second sub-A/D converter block, and (d) a digital error correction circuit (logic) 50. The sub-stage STG1 is provided with a sub-D/A converter 43 and a sub-A/D converter 44 as a sub-operational-circuit. The sub-stage STG2 is provided with a sub-D/A converter 45 and a sub-A/D converter 46 as a sub-operational-circuit. The sub-stage STG3 is provided with a sub-D/A converter 47 and a sub-A/D converter 48 as a sub-operational-circuit. The sub-stage STG4 is provided with a sub-A/D converter 49, but has no necessity to have a sub-D/A converter.

The sample-and-hold circuit 42, and the sub-stages STG1 through STG4 are operated in response to clock signals CLK that have a same phase. The sample-and-hold circuit 42 carries out the amplification and the holding operation of voltages VINP and VINM of the input signal. The sub-stage STG1 receives an analog output signal of the sample-and-hold circuit 42 as its input signal. The input signal is subjected to the A/D conversion and by the sub-A/D converter 44 so as to determine a predetermined-numbered bit (the n-th bit (n: a predetermined number)) such as MSB (Most Significant Bit). The bit thus determined is sent to the sub-D/A converter 43 and the digital error correction circuit 50, respectively. The sub-D/A converter 43 a difference between an input signal that is commonly sent to the sub-A/D converter 44 and an analog value corresponding to the bit information outputted from the sub-A/D converter 44 so as to determine and send an output signal to the following sub-stage STG2. Thus, each bit of the digital output is successively determined by the respective sub-stages STG1 through STG3. The sub-stage STG4 converts the output signal, of the sub-stages STG3 that is the final stage of the first sub-A/D converter block, into the remaining bit information. All the bit information are corrected by the digital error correction circuit 50 so as to be outputted as 4-bit digital signal. Note that there is a case where only a single first A/D converter block is provided. This depends on the number of the output bits.

According to the present embodiment, either one of the SHA circuits described in the first through third embodiments is adapted as the sub-D/A converters 43, 45, and 47 in the pipelined A/D converter 41. This allows to provide a pipelined A/D converter that can realize the low power consumption. Further, in the case of providing phase compensation resistors, when the switches that short-circuit the respective phase compensation resistors are further provided, it is possible to provide a pipelined A/D converter that can operate at a high speed.

FIG. 10 shows a circuit configuration of the respective sub-D/A converters when the SHA circuit SH1 described in the first embodiment is adapted. Note that, in order to realize the function of a 1-bit D/A converter, in FIG. 10, reference voltages +VREF and −VREF are set as the reference voltage VREFA shown in FIG. 1, and either one of reference voltages is selected by a switch 51 that is realized by an analog switch. For example, when an output DIN of the sub-A/D converter is "1", the reference voltage +VREF is selected by the switch 51. When the output DIN of the sub-A/D converter is "−1", the reference voltage −VREF is selected by the switch 51. In this case, in FIG. 10, a voltage VIN is set as the reference voltage VREFB shown in FIG. 1. The voltage VOUT is shown by the equation (2) under the provision that the capacitance $C_s$ of the capacitor 4 is equal to the capacitance $C_f$ of the capacitor 5.

$$VOUT = 2VIN - DIN \times VREF \quad (2)$$

Further, Table 1 shows the load $C_L$ ($C_{L1}$, $C_{L2}$) that is viewed from the operational amplifier stage 2, slewing rates $SR_1$, $SR_2$, and band widths $BW_{CL1}$, $BW_{CL2}$ as (a) the characteristics of the respective sample-and-hold circuits, that are constituted by the operational amplifier stage 2 and the phase compensation capacitor 6, of the sub-D/A converters 43, 45, and 47 during the first operation phase φ1 and (b) the characteristics of the entire SHA circuit SH1 during the second operation phase φ2.

TABLE 1

| | SAMPLE-AND-HOLD CIRCUIT (φ 1) | SHA CIRCUIT (φ 2) |
|---|---|---|
| LOAD$C_L$ | $C_{L1} = C_s + C_f$ | $C_{L2} = \dfrac{C_s C_f}{C_s + C_f}$ |
| SLEWING RATE | $SR_1 = \dfrac{I_2}{C_C + C_{L1}}$ | $SR_2 = \min\left\{\dfrac{I_1}{C_C}, \dfrac{I_2}{C_C + C_{L2}}\right\}$ |
| BAND WIDTH | $BW_{CL1} = \dfrac{gm_2}{C_{L1}}$ | $BW_{CL2} = \dfrac{gm_1}{C_C} f$ |

Figure 13:
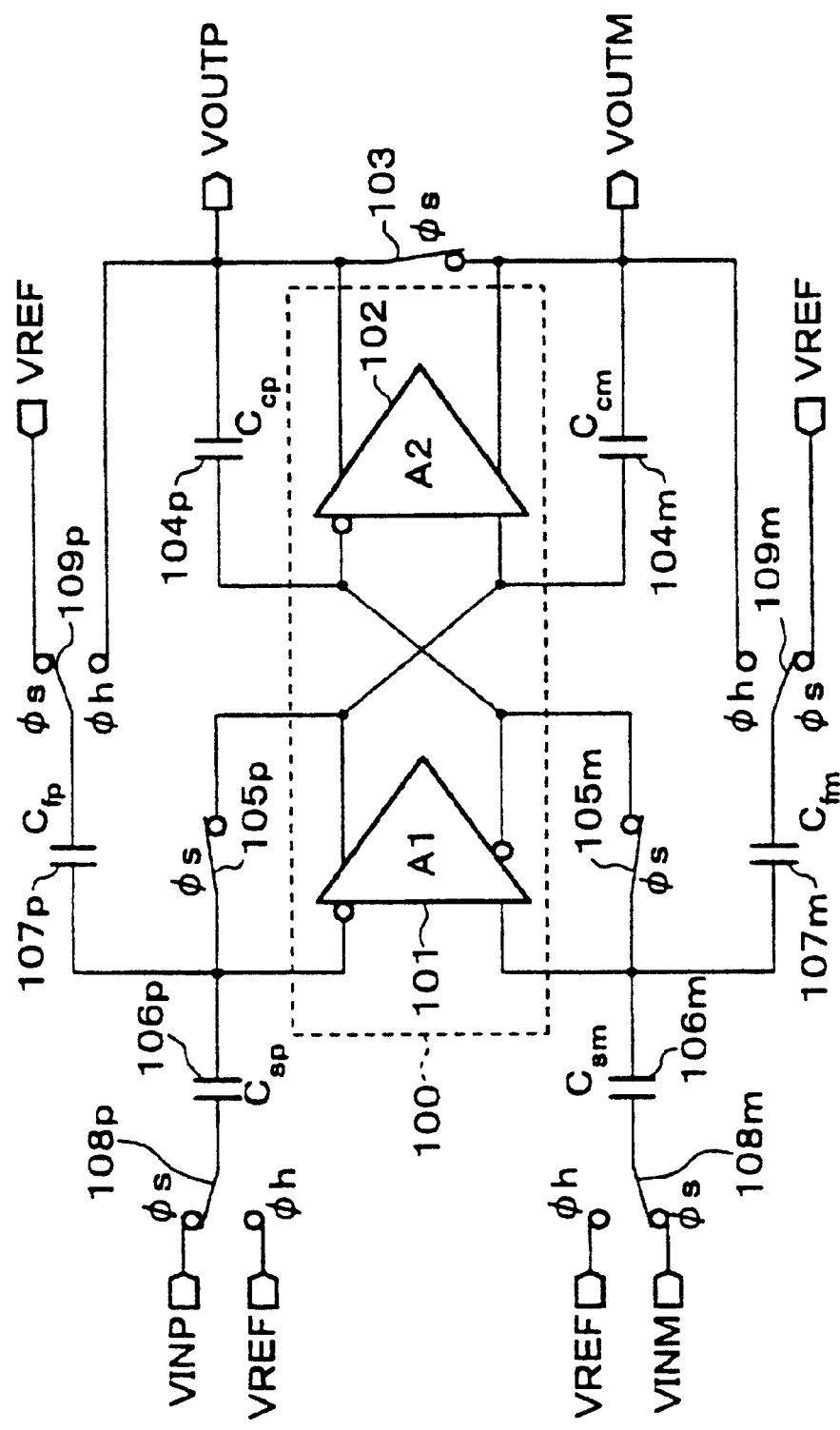
FIG. 13 is a circuit block diagram showing a structure of a conventional sample-and-hold amplifier circuit.
Figure 14:
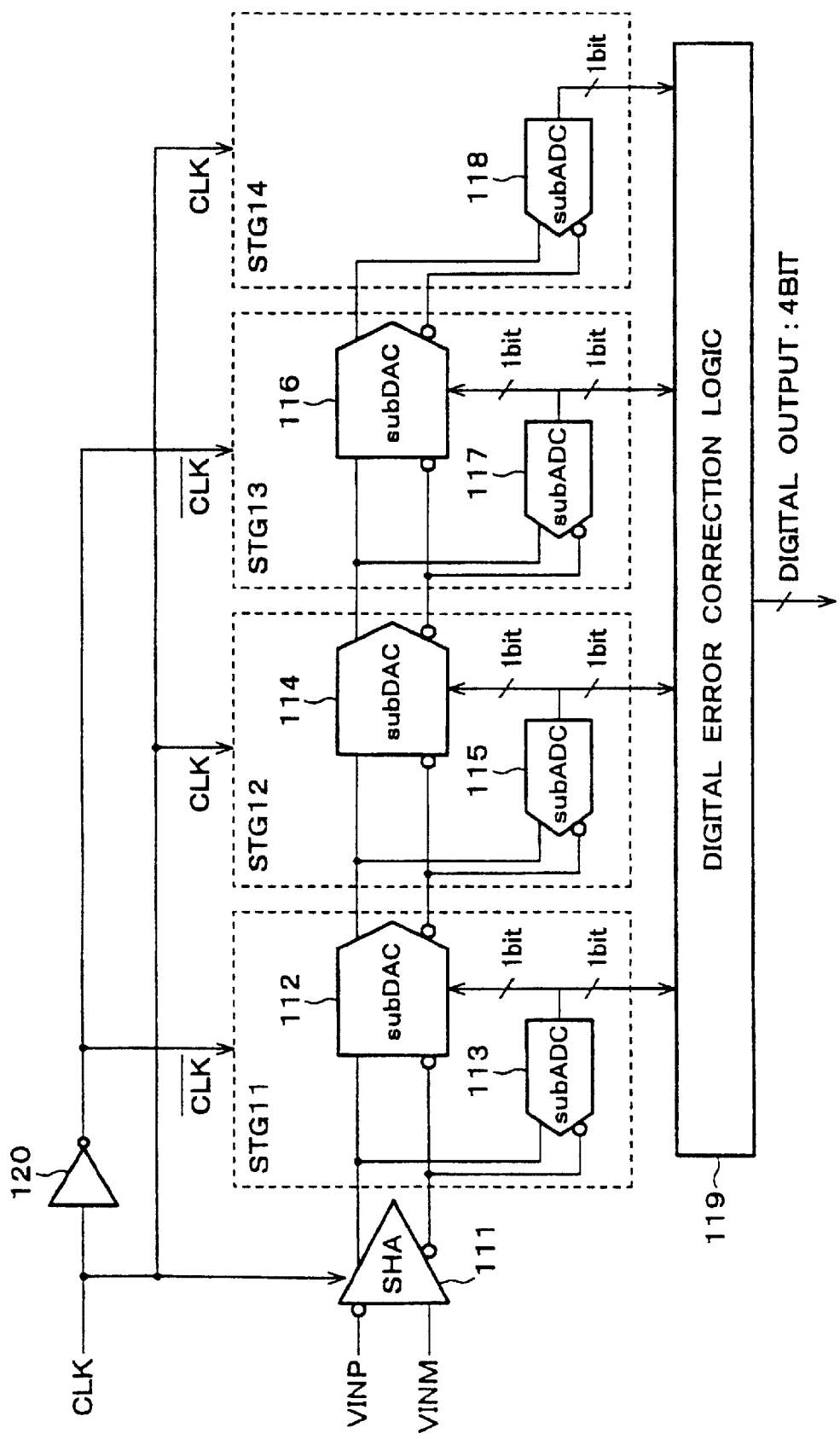
FIG. 14 is a block diagram showing a structure of a conventional pipelined A/D converter.
Figure 15:
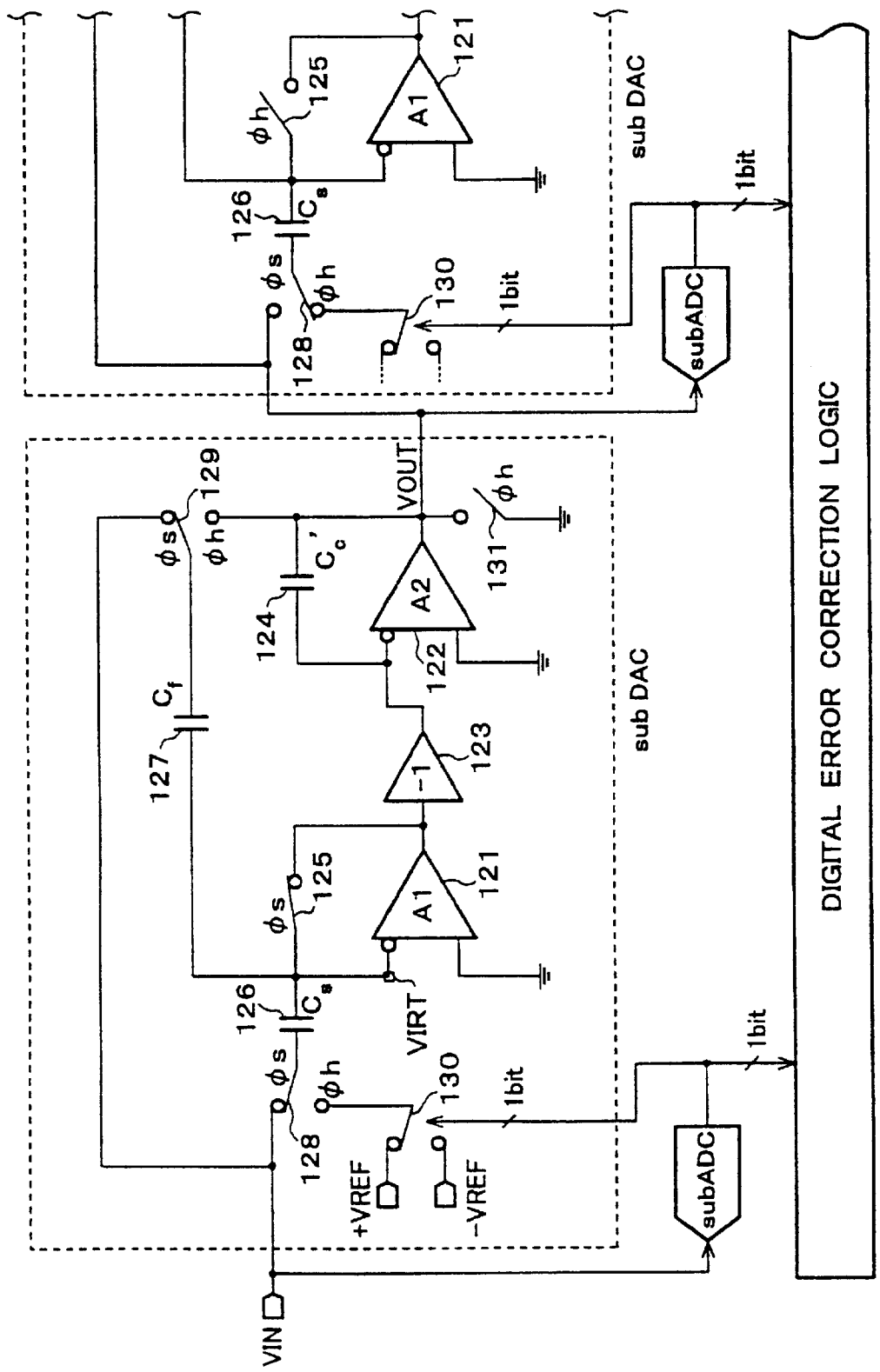
FIG. 15 is a circuit block diagram showing a structure of a sub-operational-circuit for use in the pipelined A/D converter shown in FIG. 14.

In Table 1, $gm_1$ and $gm_2$ indicate transconductance of the operational amplifier stages 1 and 2, $I_1$ and $I_2$ indicate consumed current of the operational amplifier stages 1 and 2, $C_c$ indicates the capacitance of the phase compensation capacitor 6, and f indicates a feedback coefficient of the SHA circuit SH1. Note that it is assumed that the operational amplifier stages 1 and 2 are A-class amplifiers, respectively. The load $C_L'$, the slewing rate $SR'$, and the band width $BW_{CL}'$, when viewed from an operational amplifier stage 122, of sub-D/A converter shown in FIG. 15 that is structured based on the SHA circuit shown in FIG. 13 are shown in Table 2.

TABLE 2

| | SHA CIRCUIT (φ 2) |
|---|---|
| LOAD$C_L'$ | $C_L' = C_S + \dfrac{C_S C_f}{C_S + C_f}$ |
| SLEWING RATE | $SR' = \min\left\{\dfrac{I_1}{C_C'}, \dfrac{I_2}{C_C' + C_L'}\right\}$ |
| BAND WIDTH | $BW_{CL}' = \dfrac{gm_1}{C_C'} f$ |

In Table 2, $gm_1$ indicates the transconductance of an operational amplifier stage 121, $I_1$ and $I_2$ indicate consumed current of the operational amplifier stages 121 and 122, $C_c'$ indicates the capacitance of a phase compensation capacitor 124, and f indicates a feedback coefficient of the SHA circuit. Note that it is assumed that the operational amplifier stages 121 and 122 are A-class amplifiers, respectively.

As is clear from Tables 1 and 2, $C_{L2} < C_{L1} < C_L'$ is satisfied. The load $C_L$ viewed from the operational amplifier stage 2 shown in FIG. 10 is smaller than the load $C_L'$ viewed from the operational amplifier stage 122 shown in FIG. 15. Accordingly, the slewing rate is improved because the load is thus reduced. As shown in FIG. 2 in the first embodiment, the limit with regard to the slewing rate is further alleviated according to the sample-and-hold amplifier circuit of the present invention.

In order to ensure the phase margin of the operational amplifier that is constituted by the operational amplifier stages 1 and 2, the inverting amplifier stage 3, the phase compensation capacitor 6, and the switch 10 that connects or cuts off the connection of the operational amplifier stages, it is general to design so that $gm_2/C_L$ becomes closer to $L \times gm_1/C_c$ (L falls within a range of 4 to 10). Here, the factor L is determined in accordance with the design. As has described above, it is possible to reduce the load $C_L$ according to the sample-and-hold circuit of the present invention. This allows to reduce the capacitance $C_c$ based on the above relation, i.e., to satisfy $C_c < C_c'$. Accordingly, $BW_{CL1} \gg BW_{CL2} \gg BW_{CL}'$ is satisfied. Thus, it is possible to improve the slewing rate and the band width more than the case of the circuit configuration shown in FIG. 15.

In the present embodiment, it is assumed that 1-bit is inputted to the sub-D/A converters 43, 45, and 47. The present invention is not limited to this. Namely, according to the present invention, it is also possible to constitute a sub-D/A converter that receives multiple bits. The sub-D/A converters 43, 45, and 47 shown in FIG. 10 are realized by respective single ended circuits. It is also possible to easily realize those converters by the differential circuits, instead of the single ended circuits, as described in the first through third embodiments. Further, the foregoing description deals with the pipelined A/D converter 41 of 1 bit per 1 stage type, the present invention is not limited to this. Namely, it is also possible to constitute a pipelined A/D converter of multiple bits per 1 stage.

Fifth Embodiment

Figure 11:
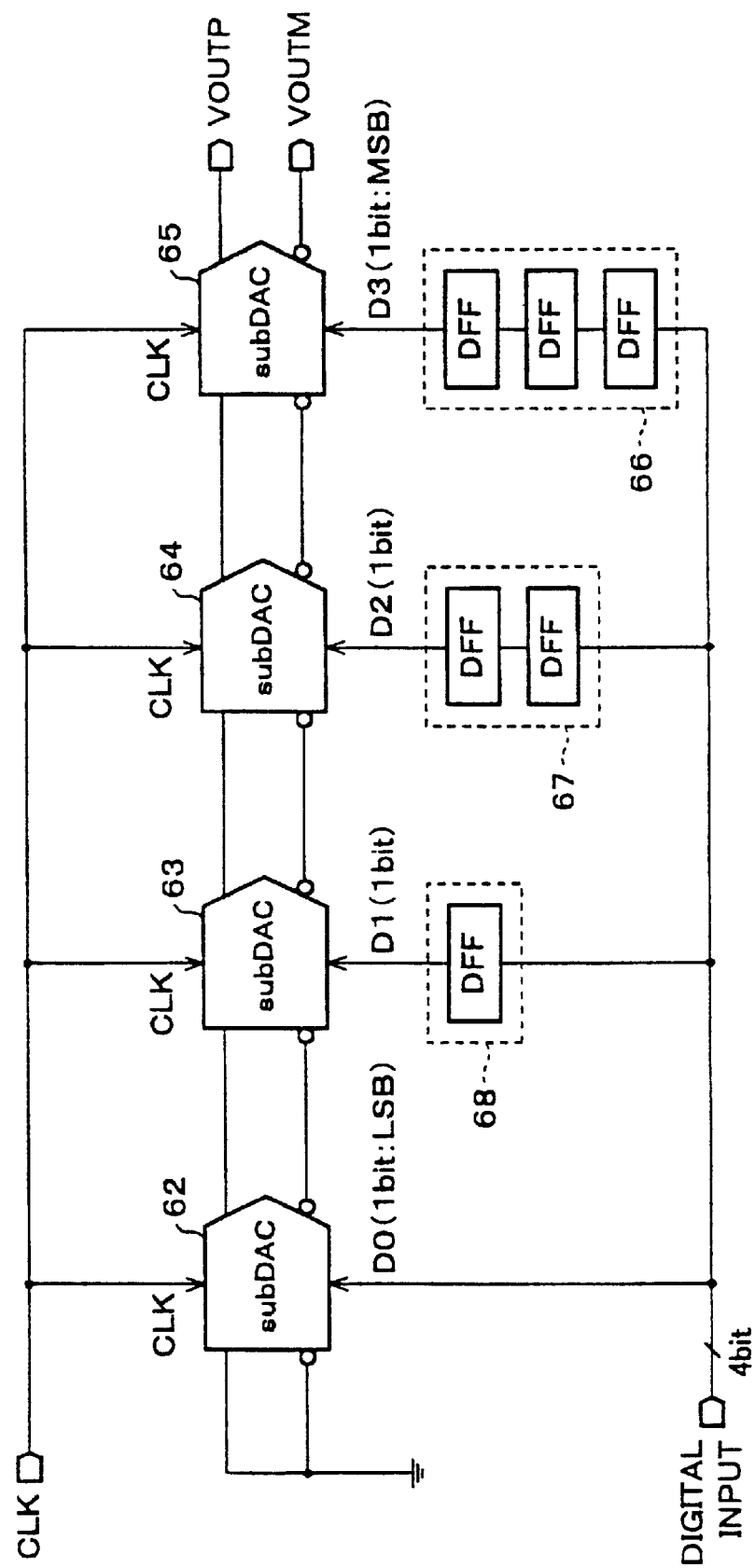
FIG. 11 is a block diagram showing a structure of a pipelined D/A converter in accordance with the fifth embodiment of the present invention.
Figure 12:
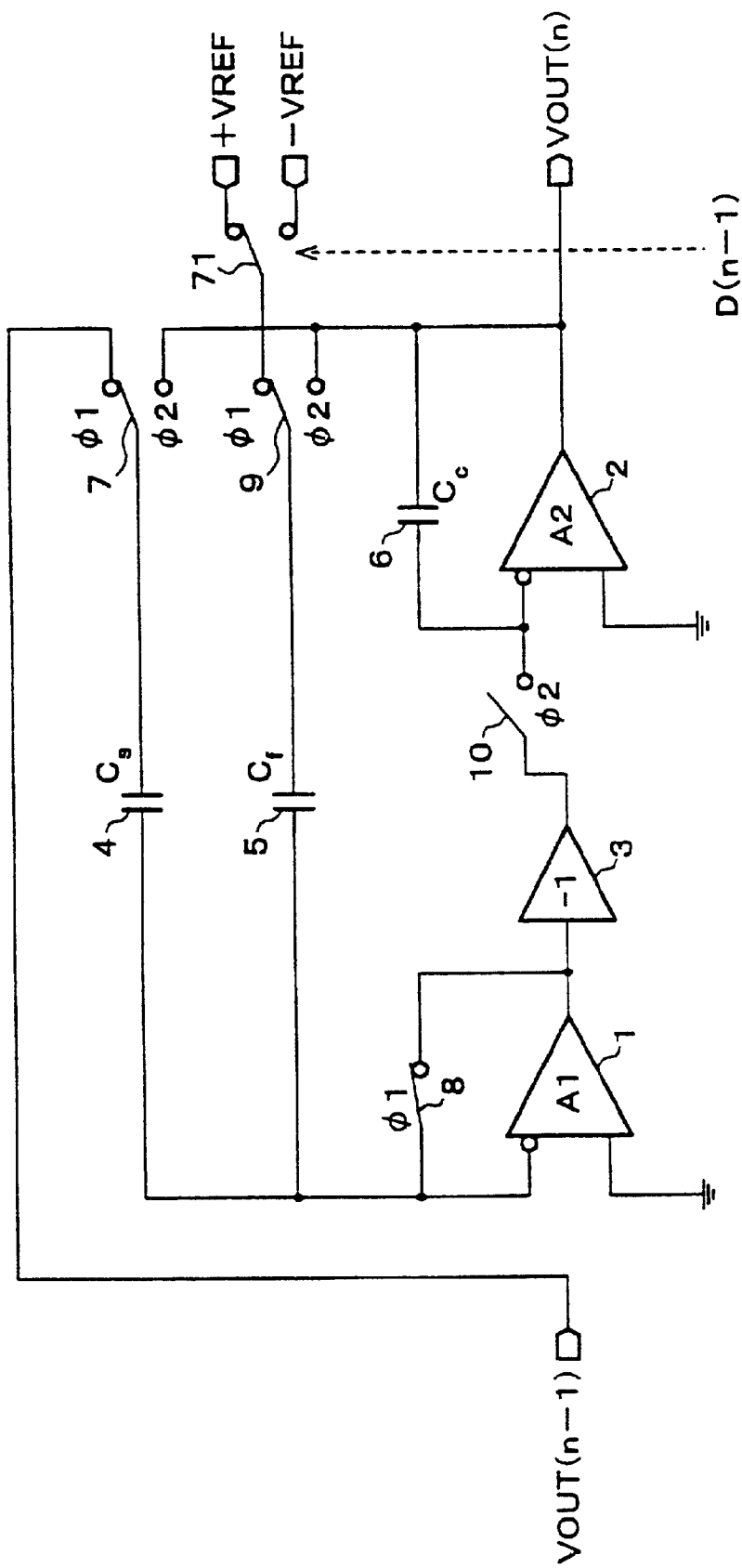
FIG. 12 is a circuit block diagram showing a structure of a sub-D/A converter for use in the pipelined D/A converter shown in FIG. 10.

The following description deals with the fifth embodiment of the present invention with reference to FIGS. 11 and 12. Note that the circuit elements that have the same functions as those of the foregoing first through fourth embodiment have the same reference numerals, respectively, and the description thereof is omitted.

FIG. 11 shows the circuit configuration of a pipelined D/A converter 61 in accordance with the present embodiment. The pipelined D/A converter 61 is provided with sub-D/A converters 62 through 65 and digital delay circuits 66 through 68. The respective sub-D/A converters are operated in response to clock signals CLK having a same phase. Each converter converts a predetermined bit information D(n−1) of the later described digital signal into an analog value. Each converter calculates and amplifies an analog output signal corresponding to an analog input signal and the analog value thus converted so as to send it to the sub-D/A converter of the next stage. Note that (n−1) is equal to 0, 1, 2, or 3. The bit information D(n−1) is an input bit whose value is ±1 of the sub-D/A converter. The GND level is applied to an input terminal of the sub-D/A converter 62. When the sub-D/A converter 65 (the final stage) outputs voltages VOUTP and VOUTM, the digital signal is converted into a final analog signal.

The digital delay circuit 66 is composed of 3 D-type flip-flops. The information of the most significant bit (MSB) of the digital signal is delayed by the D-type flip-flops so as to be sent to the sub-D/A converter 65 as bit information D3. The digital delay circuit 67 is provided with 2 D-type flip-flops. The next carry (figure) of the digital signal is delayed by the D-type flip-flops so as to be sent to the sub-D/A converter 64 as bit information D2. The digital delay circuit 68 is provided with a D-type flip-flop. The further next carry (figure) of the digital signal is delayed by the D-type flip-flop so as to be sent to the sub-D/A converter 63 as bit information D1. The information of the least significant bit (LSB) of the digital signal is sent to the sub-D/A converter 62 as bit information D0 without being delayed. As the analog output signal of the sub-D/A converter 62 is transmitted to the sub-D/A converters 63, 64, and 65, in this order, the analog signals corresponding to the respective carries (figures) of the digital signal are added and outputted from the sub-D/A converters 65.

According to the present embodiment, either one of the SHA circuits described in the first through third embodiments is adapted as the sub-D/A converters 62 through 65 in the pipelined D/A converter 61. This allows to provide a pipelined D/A converter that can realize the low power consumption. Further, in the case of providing phase compensation resistors, when the switches that short-circuit the respective phase compensation resistors, it is possible to provide a pipelined D/A converter that can operate at a high speed.

FIG. 12 shows a circuit configuration of the respective sub-D/A converters when the SHA circuit SH1 described in the first embodiment is adapted. Note in FIG. 12 that the voltage VIN is indicated as VOUT(n−1) and the voltage VOUT is indicated as VOUT(n). Reference voltages +VREF and −VREF are set as the reference voltage VREFB shown in FIG. 1, and either one of the reference voltages is selected by a switch 71 that is realized by an analog switch. For example, when bit information D(n−1) is "1", the reference voltage +VREF is selected by the switch 71. When the bit information D(n−1) is "−1", the reference voltage −VREF is selected by the switch 71. In this case, in FIG. 12, the reference voltage VREFA shown in FIG. 1 is indicated as a voltage VOUT(n). The voltage VOUT(n) is shown by the equation (3) under the provision of $C_s=C_f$.

$$VOUT(n)=(\tfrac{1}{2})[D(n-1)\times VREF+VOUT(n-1)] \quad (3)$$

When connecting a plurality of sub-D/A converters having the above circuit configuration in a series manner, an analog output signal which is subjected to the weighting in accordance with the bit information D(n−1) is obtained.

FIG. 12 deals with the circuit configuration which is realized by the single ended circuits. It is also possible to easily realize those converters by the differential amplifiers, instead of the single ended circuits. Further, the input bit of each sub-D/A converter is 1 bit in FIGS. 11 and 12. Alternatively, when capacitors and switches are further provided in FIG. 12, the input bit can be multiple bits.

A sample-and-hold amplifier circuit in accordance with the present invention, as has been described above, is provided with a sampling circuit that carries out the sampling of an input signal and an operational amplifier that carries out the operational amplification of the input signal that has been subjected to the sampling by the sampling circuit. The operational amplifier is further provided with first and second operational amplifier stages that are connected with each other in a series manner, a switch, provided between an output terminal of the first operational amplifier stage and an input terminal of the second operational amplifier stage, that connects or cuts off the connection of the first and second operational amplifier stages so as to be nonconductive in a first operation phase during which the sampling is carried out and so as to be conductive in a second operation phase during which the operational amplifier entirely carries out the operational amplification, and a phase compensation capacitor provided between an output terminal and the input terminal of the second operational amplifier stage.

With the arrangement, since the switch that connects or cuts off the connection of the first and second operational amplifier stages is nonconductive in the first operation phase, the output voltage of the second operational amplifier stage is not reset during the sampling. This allows that, during the first operation phase, the second operational amplifier stage carries out, together with the phase compensation capacitor, the holding operation of the voltage that has been subjected to the operational amplification in the second operation phase during which the switch is conductive (closed).

Thus, it is possible to use the power consumption of the second operational amplifier stage for the signal processing, in the first operation phase. Accordingly, it is possible to prolong the period of time during which the output signal is outputted from the sample-and-hold amplifier circuit. This is based on the fact that, when the sample-and-hold amplifier circuit is operated in response to the operation clock having a duty ratio of 50 percent, the period of time during which the output signal is outputted from the second operational amplifier stage becomes doubled compared with the conventional case. This indicates that it is possible to prolong the period of time for sending the signal that has been amplified by the sample-and-hold amplifier circuit to the next stage. Since the load is driven for a longer time, the low power consumption can be realized, accordingly. Further, it is possible to use the power consumption of the second operational amplifier stage for the signal processing, in the first operation phase. This causes the output voltage of the sample-and-hold amplifier circuit to vary a little when the frequency of the input signal is low. This allows to alleviate a slewing rate of the second operational amplifier stage and to realize the low power consumption.

As has been described above, it is possible to provide a sample-and-hold amplifier circuit that can realize the low power consumption.

It is preferable in the sample-and-hold amplifier circuit, as has been described above, that the operational amplifier is further provided with (a) a phase compensation resistor provided between the output terminal of the second operational amplifier stage and the input terminal of the second operational amplifier stage so as to be connected with the phase compensation capacitor in a series manner and (b) a switch for short-circuiting the phase compensation resistor, connected with the phase compensation resistor in a parallel manner, that is conductive during the first operation phase and is nonconductive during the second operation phase.

With the arrangement, since the switch is connected with the phase compensation resistor in a parallel manner, it is possible to suppress the deterioration of the settling characteristic caused by the phase compensation resistor with respect to the sample-and-hold amplifier circuit that is constituted by the second operational amplifier stage, the phase compensation capacitor, and the phase compensation resistor during the first operation phase. This ensures a high speed operation.

Another sample-and-hold amplifier circuit in accordance with the present invention, as has been described above, is provided with a sampling circuit that carries out the sampling of an input signal and an operational amplifier that carries out the operational amplification of the input signal that has been subjected to the sampling by the sampling circuit. The operational amplifier is further provided with (1) multiple operational amplifier stages that are connected with each other in a series manner, (2) a switch, that (a) connects or cuts off a connection of the operational amplifier stages, (b) is nonconductive during the first operation phase during which the sampling is carried out, and (c) is conductive in the second operation phase during which the operational amplification is carried out by the operational amplifier as a whole, said switch being provided between either one pair of neighboring first and second operational amplifier stages so as to be provided between an output terminal of the first operational amplifier stage and an input terminal of the second operational amplifier stage, and (3) phase compensation capacitors provided between an output terminal of a final operational amplifier stage and at least the input terminal of the second operational amplifier stage.

With the arrangement, since the switch that connects or cuts off a connection of the operational amplifier stages is nonconductive in the first operation phase, the output voltages of the operational amplifier stages following the switch is not reset during the sampling. This allows that, during the first operation phase, the operational amplifier stages following the switch carries out, together with the phase compensation capacitor, the holding operation of the voltage that has been subjected to the operational amplification in the second operation phase during which the switch becomes conductive (closed).

Thus, it is possible to use the power consumption of the operational amplifier stages following the switch for the signal processing, in the first operation phase. Accordingly, it is possible to prolong the period of time during which the output signal is outputted from the sample-and-hold amplifier circuit. This is based on the fact that, when the sample-and-hold amplifier circuit is operated in response to the operation clock having a duty ratio of 50 percent, the period of time during which the output signal is outputted from the final operational amplifier stage becomes doubled compared with the conventional case. This indicates that it is possible to prolong the period of time for sending the signal that has been amplified by the sample-and-hold amplifier circuit to the next stage. Since the load is driven for a longer time, the low power consumption can be realized, accordingly. Further, it is possible to use the power consumption of the operational amplifier stages following the switch for the signal processing, in the first operation phase. This causes the output voltage of the sample-and-hold amplifier circuit to vary a little when the frequency of the input signal is low. This allows to alleviate slewing rates of the respective operational amplifier stages following the switch and to realize the low power consumption.

As has been described above, it is possible to provide a sample-and-hold amplifier circuit that can realize the low power consumption.

It is preferable, as has been described above, that the operational amplifier is further provided with (a) phase compensation resistors provided between the output terminal of the final operational amplifier stage and the input terminals of the operational amplifier stages following the switch so as to be respectively connected with the phase compensation capacitors in a series manner; and (b) a switch for short-circuiting the phase compensation resistor, connected in a parallel manner with the phase compensation resistor that is provided between the output terminal of the final operational amplifier stage and the input terminals of an operational amplifier stage following the switch so as to be connected with the phase compensation resistor, which is connected to the phase compensation capacitor, in a series manner, the switch being conductive during the first operation phase and being nonconductive during the second operation phase.

With the arrangement, the switch is connected in a parallel manner with the phase compensation resistor that is provided between the output terminal of the final operational amplifier stage and the input terminal of the operational amplifier stage following the switch so as to be connected with the phase compensation capacitor in a series manner. Accordingly, it is possible to suppress the deterioration of the settling characteristic caused by the phase compensation resistor with respect to the sample-and-hold amplifier circuit that is constituted by the operational amplifier stages following the switch, the phase compensation capacitors, and the phase compensation resistors during the first operation phase. This ensures a high speed operation.

A pipelined A/D converter in accordance with the present invention is provided with (a) at least one first sub-A/D converter blocks, connected with each other in a series manner, that include (1) a sub-A/D converter that converts an input signal into a predetermined-numbered bit information and (2) a sub-operational-circuit which converts the bit information into an analog value, carries out an operational amplification with respect to a difference between the analog value and the input signal so as to output the difference that has been subjected to the operational amplification, and (b) a second sub-A/D converter block that includes a sub-A/D converter which converts an output signal of the first sub-A/D converter block of the final stage into remainder of the bit information, either one of the above-described sample-and-hold amplifier circuits being used as the sub-operational-circuit.

With the pipelined A/D converter, either one of the above-described sample-and-hold amplifier circuits is used as the sub-operational-circuit which converts the bit information that has been converted by the sub-A/D converter into the analog value and into an analog value, carries out the operational amplification with respect to the difference between the analog value and the input signal so as to output the difference that has been subjected to the operational amplification. This allows to provide a pipelined A/D converter that can realize the low power consumption. When a switch that short-circuits the phase compensation resistor is further provided, it is possible to provide another pipelined A/D converter that can operate at a high speed.

A pipelined D/A converter in accordance with the present invention in which a plurality of sample-and-hold circuits that have been described above are connected with each other in a series manner and are used as a sub-D/A converter that converts a predetermined-numbered bit information of a digital signal into an analog value, the sub-D/A converter carries out the operational amplification with respect to an analog input signal and an analog signal corresponding to the predetermined-numbered bit information and send it to the sub-D/A converter of the next stage so that the sub-D/A converter of the final stage outputs an analog signal corresponding to the digital signal.

With the pipelined D/A converter, the sample-and-hold circuit that has been described above are used as the sub-D/A converter in which the predetermined-numbered bit information of the digital signal is converted into the analog value, the analog signal and the analog signal that corresponds to the predetermined-numbered bit information are subjected to the operational amplification so as to be sent to the next stage. This allows to provide a pipelined D/A converter that can realize the low power consumption. In the case where the phase compensation resistor is provided, when a switch that short-circuits the phase compensation resistor is further provided, it is possible to provide another pipelined D/A converter that can operate at a high speed.

There are described above novel features which the skilled man will appreciate give rise to advantages. These are each independent aspects of the invention to be covered by the present application, irrespective of whether or not they are included within the scope of the following claims.

What is claimed is:

1. A load driving sample-and-hold amplification circuit, comprising:
   a sampling circuit that carries out a sampling of an input signal; and
   an operational amplifier that carries out an operational amplification of the input signal that has been subjected to the sampling by the sampling circuit,
   wherein the operational amplifier includes:
      first and second operational amplifier stages that are connected in this order in a series manner;
      a first switch, provided between an output terminal of the first operational amplifier stage and an input terminal of the second operational amplifier stage, that connects or cuts off connection of a connection of the first and second operational amplifier stages so as to be nonconductive in a first operation phase during which the sampling is carried out and so as to be conductive in a second operation phase during which the operational amplifier, as a whole, carries out the operational amplification;
      a phase compensation capacitor provided between an output terminal and the input terminal of the second operational amplifier stage; and
      a second switch provided between the output terminal of the second operational amplifier stage and a load, means for causing the second switch to connect or cut off a connection of the second operational amplifier stage and the load wherein the means causes the second switch to be conductive in the first operation phase and nonconductive in the second operation phase so that the second switch is conductive when the first switch is nonconductive, and vice versa, whereby driving time of amplification differs from drive time of the load so that low power consumption is realized.

2. The load driving sample and hold amplification circuit as set forth in claim 1, wherein the operational amplifier further includes a phase compensation resistor provided between the input and output terminals of the second operational amplifier stage so as to be connected with the phase compensation capacitor in a series manner.

3. A sample-and-hold amplifier circuit, comprising:
   a sampling circuit that carries out a sampling of an input signal; and
   an operational amplifier that carries out an operational amplification of the input signal that has been subjected to the sampling by the sampling circuit,
   wherein the operational amplifier includes:
      first and second operational amplifier stages that are connected in this order in a series manner;
      a switch, provided between an output terminal of the first operational amplifier stage and an input terminal of the second operational amplifier stage, that connects or cuts off connection of a connection of the first and second operational amplifier stages so as to be nonconductive in a first operation phase during which the sampling is carried out and so as to be conductive in a second operation phase during which the operational amplifier, as a whole, carries out the operational amplification; and
      a phase compensation capacitor provided between an output terminal and the input terminal of the second operational amplifier stage;
      wherein the operational amplifier includes: a phase compensation resistor provided between the input and output terminals of the second operational amplifier stage so as to be connected with the phase compensation capacitor in a series manner; and a second switch for short-circuiting the phase compensation resistor, connected with the phase compensation resistor in a parallel manner, that is conductive during the first operation phase and is nonconductive during the second operation phase.

4. A load driving sample-and-hold amplification circuit, comprising:
   a sampling circuit that carries out a sampling of an input signal; and
   an operational amplifier that carries out an operational amplification of the input signal that has been subjected to the sampling by the sampling circuit,
   wherein the operational amplifier includes:
      multiple operational amplifier stages that are connected with each other in a series manner;
      a first switch that: (a) connects or cuts off a connection of the operational amplifier stages, (b) is nonconductive during a first operation phase during which the sampling is carried out, and (c) is conductive in a second operation phase during which the operational amplification is carried out by the operational amplifier as a whole, said first switch being provided between neighboring first and second operational amplifier stages so as to be provided between an output terminal of the first operational amplifier stage and an input terminal of the second operational amplifier stage;
      phase compensation capacitors coupled to an output terminal of a final operational amplifier stage so that at least one of the phase compensation capacitors is provided between the output terminal of the final operational amplifier stage and the input terminal of the second operational amplifier stage; and a second switch provided between the output terminal of the final operational amplifier stage and a load, the second switch connecting or cutting off a connection of the final operational amplifier stage and the load so as to be conductive in the first operation phase and nonconductive in the second operation phase.

5. The load driving sample-and-hold amplification circuit as set forth in claim 4, wherein the operational amplifier includes:

phase compensation resistors in communication with the output terminal of the final operational amplifier stage so as to be respectively connected with the phase compensation capacitors in a series manner; and a third switch for short-circuiting one of the phase compensation resistors, the third switch being connected in a parallel manner with the one phase compensation resistor and connected to one of the phase compensation capacitors in a series manner, the third switch being conductive during the first operation phase and being nonconductive during the second operation phase.

6. A pipelined A/D converter, comprising:

first sub-A/D converter blocks, connected with each other in a series manner, that each directly receive a clock signal and include (a) a sub-A/D converter that converts an input signal into a predetermined-numbered bit information and (b) a sub-operational-circuit which converts the bit information into an analog value, carries out an operational amplification with respect to a difference between the analog value and the input signal so as to output the difference that has been subjected to the operational amplification, and a second sub-A/D converter block that includes a sub-A/D converter which converts an output signal of the first sub-A/D converter block of a final stage into a remainder of the bit information, said sub-operational-circuit being a sample-and-hold amplifier circuit that includes:

a sampling circuit that carries out a sampling of the input signal; and an operational amplifier that carries out an operational amplification of the input signal that has been subjected to the sampling by the sampling circuit, said operational amplifier including:

first and second operational amplifier stages that are connected in this order in a series manner;

a switch, provided between an output terminal of the first operational amplifier stage and an input terminal of the second operational amplifier stage, that connects or cuts off connection of a connection of the first and second operational amplifier stages so as to be nonconductive in a first operation phase during which the sampling is carried out and so as to be conductive in a second operation phase during which the operational amplifier, as a whole, carries out the operational amplification; and a phase compensation capacitor provided between an output terminal and the input terminal of the second operational amplifier stage.

7. The pipelined A/D converter as set forth in claim 6, wherein the operational amplifier further includes:

a phase compensation resistor provided between the input and output terminals of the second operational amplifier stage so as to be connected with the phase compensation capacitor in a series manner;

a second switch for short-circuiting the phase compensation resistor, connected with the phase compensation resistor in a parallel manner, that is conductive during the first operation phase and is nonconductive during the second operation phase.

8. The pipelined A/D converter as set forth in claim 6, wherein the operational amplifier further includes a phase compensation resistor provided between the input and output terminals of the second operational amplifier stage so as to be connected with the phase compensation capacitor in a series manner.

9. The converter of claim 6, wherein the first and second amplifier stages are adjacent one another and are connected, and wherein each of the first and second amplifier stages receives the clock signal.

10. A pipelined A/D converter, comprising:

at least one first sub-A/D converter blocks, connected with each other in a series manner, wherein each of the at least one first sub-A/D converter block(s) include (a) a sub-A/D converter that converts an input signal into a predetermined-numbered bit information and (b) a sub-operational-circuit which converts the bit information into an analog value, carries out an operational amplification with respect to a difference between the analog value and the input signal so as to output the difference that has been subjected to the operational amplification, and a second sub-A/D converter block that includes a sub-A/D converter which converts an output signal of the first sub-A/D converter block of the final stage into a remainder of the bit information, said sub-operational-circuit being a sample-and-hold amplifier circuit that includes:

a sampling circuit that carries out a sampling of the input signal; and an operational amplifier that carries out an operational amplification of the input signal that has been subjected to the sampling by the sampling circuit, said operational amplifier including:

multiple operational amplifier stages that are connected with each other in a series manner;

a switch, that (a) connects or cuts off a connection of the operational amplifier stages, (b) is nonconductive during the first operation phase during which the sampling is carried out, and (c) is conductive in the second operation phase during which the operational amplification is carried out by the operational amplifier as a whole, said switch being provided between neighboring first and second operational amplifier stages so as to be provided between an output terminal of the first operational amplifier stage and an input terminal of the second operational amplifier stage; and phase compensation capacitors operatively associated with an output terminal of a final operational amplifier stage so that at least one of the phase compensation capacitors is provided between the output terminal of the final operational amplifier stage and at least the input terminal of the second operational amplifier stage.

11. The pipelined A/D converter as set forth in claim 10, wherein the operational amplifier further includes:

phase compensation resistors in communication with the output terminal of the final operational amplifier stage so as to be respectively connected with the phase compensation capacitors in a series manner; and another switch for short-circuiting a first one of the phase compensation resistors, the another switch being connected in a parallel manner with said first one of phase compensation resistors and connected to one of the phase compensation capacitors in a series manner, the another switch being conductive during the first operation phase and being nonconductive during the second operation phase.

12. The converter of claim 10, wherein the first and second amplifier stages are adjacent one another and are connected, and wherein each of the first and second amplifier stages receives the clock signal.

13. A pipelined D/A converter, comprising:
a plurality of sample-and-hold amplifier circuits that are connected with each other in a series manner and each is used as a sub-D/A converter that converts a predetermined-numbered bit information of a digital signal into an analog value, each of the sample-and-hold circuits directly receiving a clock signal,
the sub-D/A converter carrying out an operational amplification with respect to an analog input signal and said analog value that corresponds to the predetermined-numbered bit information and sending the result of amplification to a sub-D/A converter of the next stage so that the sub-D/A converter of the final stage outputs an analog signal corresponding to the digital signal,
at least one of the sample-and-hold amplifier circuits including:
a sampling circuit that carries out a sampling of an input signal; and
an operational amplifier that carries out an operational amplification of the input signal that has been subjected to the sampling by the sampling circuit, the operational amplifier including:
first and second operational amplifier stages that are connected in this order in a series manner;
a switch, provided between an output terminal of the first operational amplifier stage and an input terminal of the second operational amplifier stage, that connects or cuts off connection of a connection of the first and second operational amplifier stages so as to be nonconductive in a first operation phase during which the sampling is carried out and so as to be conductive in a second operation phase during which the operational amplifier, as a whole, carries out the operational amplification; and
a phase compensation capacitor provided between an output terminal and the input terminal of the second operational amplifier stage.

14. The pipelined D/A converter as set forth in claim 13, wherein the operational amplifier further includes:
a phase compensation resistor provided between the input and output terminals of the second operational amplifier stage so as to be connected with the phase compensation capacitor in a series manner;
a second switch for short-circuiting the phase compensation resistor, connected with the phase compensation resistor in a parallel manner, that is conductive during the first operation phase and is nonconductive during the second operation phase.

15. The pipelined D/A converter as set forth in claim 13, wherein the operational amplifier further includes a phase compensation resistor provided between the input and output terminals of the second operational amplifier stage so as to be connected with the phase compensation capacitor in a series manner.

16. The converter of claim 13, wherein the first and second amplifier stages are adjacent one another and are connected, and wherein each of the first and second amplifier stages receives the clock signal.

17. A pipelined D/A converter, comprising:
a plurality of sample-and-hold amplifier circuits that are connected with each other in a series manner and each is used as a sub-D/A converter that converts a predetermined-numbered bit information of a digital signal into an analog value,
the sub-D/A converter carrying out an operational amplification with respect to an analog input signal and said analog value that corresponds to the predetermined-numbered bit information and send the result of amplification to a sub-D/A converter of the next stage so that the sub-D/A converter of the final stage outputs an analog signal corresponding to the digital signal,
at least one of the sample-and-hold amplifier circuits including:
a sampling circuit that carries out a sampling of an input signal; and
an operational amplifier that carries out an operational amplification of the input signal that has been subjected to the sampling by the sampling circuit, said operational amplifier including:
multiple operational amplifier stages that are connected with each other in a series manner;
a switch, that (a) connects or cuts off a connection of the operational amplifier stages, (b) is conductive during the first operation phase during which the sampling is carried out, and (c) is nonconductive in the second operation phase during which the operational amplification is carried out by the operational amplifier as a whole, said switch being provided between neighboring first and second operational amplifier stages so as to be provided between an output terminal of the first operational amplifier stage and an input terminal of the second operational amplifier stage; and
phase compensation capacitors coupled to an output terminal of a final operational amplifier stage so that at least one of the phase compensation capacitors is provided between the output terminal of the final operational amplifier stage and the input terminal of the second operational amplifier stage.

18. The pipelined D/A converter as set forth in claim 17, wherein the operational amplifier further includes:
phase compensation resistors coupled to the output terminal of the final operational amplifier stage so as to be respectively connected with the phase compensation capacitors in a series manner; and
another switch for short-circuiting one of the phase compensation resistors, the another switch being connected in a parallel manner with the one phase compensation resistor and wherein the another switch is conductive during the first operation phase and nonconductive during the second operation phase.

19. The converter of claim 17, wherein the first and second amplifier stages are adjacent one another and are connected, and wherein each of the first and second amplifier stages receives the clock signal.

* * * * *